US009048176B2

(12) United States Patent
Sonehara et al.

(10) Patent No.: US 9,048,176 B2
(45) Date of Patent: Jun. 2, 2015

(54) NONVOLATILE STORAGE DEVICE

(75) Inventors: Takeshi Sonehara, Mei-ken (JP); Nobuaki Yasutake, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 13/530,453

(22) Filed: Jun. 22, 2012

(65) Prior Publication Data

US 2013/0062590 A1    Mar. 14, 2013

(30) Foreign Application Priority Data

Sep. 8, 2011    (JP) ................. 2011-195656

(51) Int. Cl.
*H01L 47/00*    (2006.01)
*H01L 29/10*    (2006.01)
*H01L 27/24*    (2006.01)

(52) U.S. Cl.
CPC ........ *H01L 27/2481* (2013.01); *H01L 27/2409* (2013.01)

(58) Field of Classification Search
CPC ................. H01L 21/28518; H01L 45/1233
USPC .............. 257/4, E45.002, 5; 365/163, 175
See application file for complete search history.

(56) References Cited

U.S. PATENT DOCUMENTS

| | | | | |
|---|---|---|---|---|
| 4,499,557 A | * | 2/1985 | Holmberg et al. | ........... 365/163 |
| 5,463,254 A | * | 10/1995 | Iyer et al. | ........... 257/757 |
| 7,799,702 B1 | | 9/2010 | Tanaka | |
| 2004/0165422 A1 | * | 8/2004 | Hideki et al. | ........... 365/163 |
| 2005/0226067 A1 | * | 10/2005 | Herner et al. | ........... 365/201 |
| 2008/0128853 A1 | * | 6/2008 | Choi et al. | ........... 257/530 |
| 2009/0294751 A1 | | 12/2009 | Kiyotoshi | |

(Continued)

FOREIGN PATENT DOCUMENTS

| | | | |
|---|---|---|---|
| JP | 8-330598 A | 12/1996 | |
| JP | 2009-267219 A | 11/2009 | |

(Continued)

OTHER PUBLICATIONS

Office Action issued on Dec. 26, 2013 in the counterpart Japanese Patent Application No. 2011-195656 (with English Translation).

(Continued)

*Primary Examiner* — Jerome Jackson, Jr.
*Assistant Examiner* — Paul Budd
(74) *Attorney, Agent, or Firm* — Oblon, McClelland, Maier & Neustadt, L.L.P.

(57) ABSTRACT

According to one embodiment, a method for manufacturing a nonvolatile storage device. The device includes a plurality of first conductive layers each extending in a first direction, a plurality of second conductive layers each extending in a second direction and spaced from the first layers, and memory cells each provided between the first layers and the second layers and including a rectifying element including a semiconductor layer, and a variable resistance element stacked with the rectifying element. The method includes a film formation step, a heating step and a patterning step. The film formation step is configured to form a rectifying element material film including an amorphous semiconductor film. The heating step is configured to heat the rectifying element material film. The patterning step is configured to form the rectifying element including the semiconductor layer by patterning the rectifying element material film after the heating step.

7 Claims, 19 Drawing Sheets

(56) References Cited

U.S. PATENT DOCUMENTS

| | | |
|---|---|---|
| 2010/0237346 A1 | 9/2010 | Kanno et al. |
| 2011/0133149 A1* | 6/2011 | Sonehara .......................... 257/3 |

FOREIGN PATENT DOCUMENTS

| | | |
|---|---|---|
| JP | 2010-219343 | 9/2010 |
| JP | 2010-225868 | 10/2010 |
| JP | 2011-508458 | 3/2011 |
| JP | 2011-71167 A | 4/2011 |
| JP | 2011-119532 A | 6/2011 |
| WO | WO 2009/088888 A2 | 7/2009 |

OTHER PUBLICATIONS

Office Action issued Mar. 11, 2014 in Japanese Patent Application No. 2011-195656 (with English language translation).

* cited by examiner

US 9,048,176 B2

NONVOLATILE STORAGE DEVICE

CROSS-REFERENCE TO RELATED APPLICATIONS

This application is based upon and claims the benefit of priority from the prior Japanese Patent Application No. 2011-195656, filed on Sep. 8, 2011; the entire contents of which are incorporated herein by reference.

FIELD

Embodiments described herein relate generally to a method for manufacturing a nonvolatile storage device and a nonvolatile storage device.

BACKGROUND

Recently, as nonvolatile storage devices, electrically rewritable variable resistance elements such as ReRAM (resistance random access memory) and PRAM (phase change random access memory) have been drawing attention.

The variable resistance element used as a storage element of the nonvolatile storage device includes a structure in which an electrode (including semiconductor material), a variable resistance material such as metal oxide (binary or ternary), and an electrode (including semiconductor material) are stacked.

Variable resistance elements are classified into the bipolar type and the unipolar type. In the bipolar type, the high resistance state and the low resistance state are switched by changing the polarity of the application voltage. In the unipolar type, the high resistance state and the low resistance state are switched by controlling the voltage and the application time without changing the polarity of the application voltage. To the variable resistance element, a rectifying element is connected. The rectifying element is used so as to apply a voltage in a prescribed direction to the variable resistance element selected for data writing and reading, and not to apply the voltage in the prescribed direction to the non-selected variable resistance element. In such nonvolatile storage devices, further improvement in the characteristics of the rectifying element is desired.

DETAILED DESCRIPTION

Figure 1A:
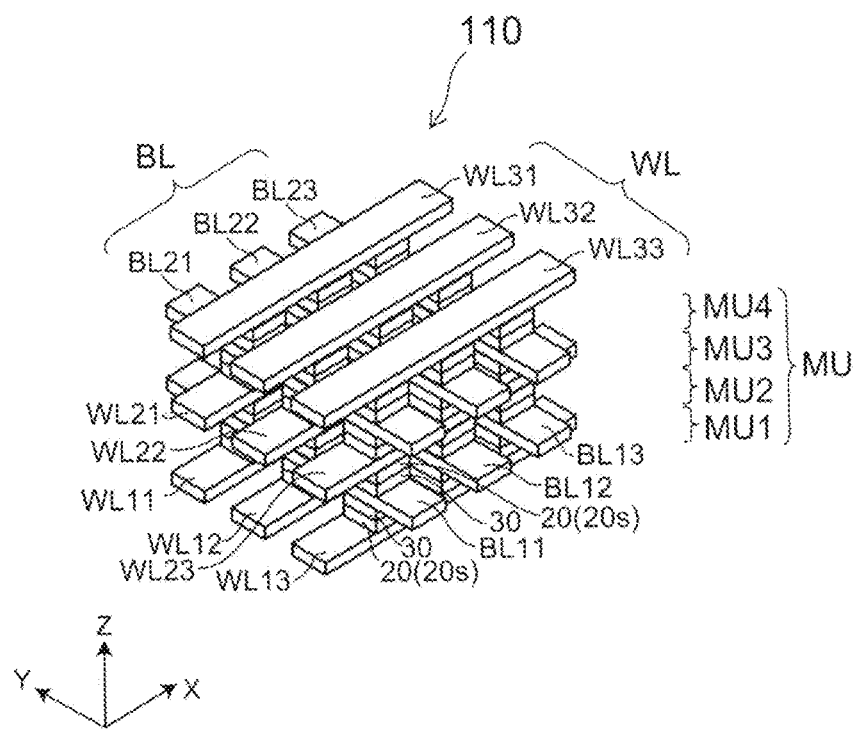
FIGS. 1A and 1B illustrate a nonvolatile storage device according to an embodiment.

In general, according to one embodiment, a method for manufacturing a nonvolatile storage device. The nonvolatile storage device includes a plurality of first conductive layers each extending in a first direction, a plurality of second conductive layers each extending in a second direction non-parallel to the first direction and spaced from the first conductive layers in a third direction orthogonal to the first direction, and memory cells each provided between the plurality of first conductive layers and the plurality of second conductive layers, the memory cell including a rectifying element including a semiconductor layer, and a variable resistance element stacked with the rectifying element in the third direction. The method includes a film formation step, a heating step and a patterning step. The film formation step is configured to form a rectifying element material film including an amorphous semiconductor film. The heating step is configured to heat the rectifying element material film. The patterning step is configured to form the rectifying element including the semiconductor layer by patterning the rectifying element material film after the heating step.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
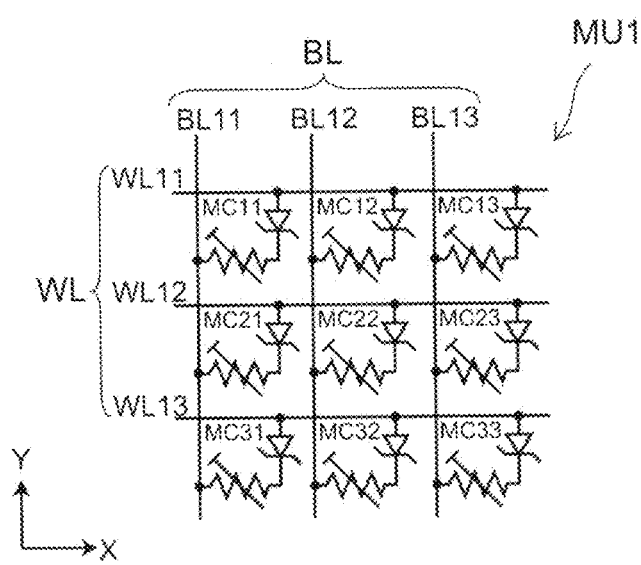

FIGS. 1A and 1B illustrate a nonvolatile storage device according to an embodiment.

FIG. 1A is a schematic perspective view of the nonvolatile storage device according to the embodiment. FIG. 1B is a circuit diagram of the nonvolatile storage device according to the embodiment.

The embodiment is described using a coordinate system of X, Y, and Z axes orthogonal to each other. The direction along the X axis is a first direction. The direction along the Y axis is an example of a second direction non-parallel to the first direction. The direction along the Z axis is a third direction. Furthermore, a plurality of first conductive layers WL11, WL12, . . . are collectively referred to as first conductive layers WL. A plurality of second conductive layers BL11, BL12, . . . are collectively referred to as second conductive layers BL. A plurality of memory cells MC11, MC12, . . . are collectively referred to as memory cells MC.

As shown in FIG. 1A, the nonvolatile storage device 110 includes a plurality of first conductive layers WL each extending in the X-axis direction, a plurality of second conductive layers BL each extending in the Y-axis direction, and memory cells MC each provided between the plurality of first conductive layers WL and the plurality of second conductive layers BL.

The first conductive layer WL is e.g. a word line. The second conductive layer BL is e.g. a bit line. The nonvolatile storage device 110 includes at least a unit memory layer MU including the first conductive layers WL in the same layer, the second conductive layers BL in the same layer, and the memory cells MC provided therebetween. As an example, the nonvolatile storage device 110 shown in FIG. 1A has a stacked structure in which three layers of first conductive layers WL and two layers of second conductive layers BL are alternately arranged and spaced from each other. Thus, the nonvolatile storage device 110 has a structure in which four unit memory layers MU1-MU4 are stacked in the Z-axis direction.

In this description, the term "stacked" includes not only the case of being stacked in contact with each other, but also the case of being stacked with another component interposed in between.

For convenience of description, FIG. 1A shows an example in which three first conductive layers WL and three second conductive layers BL are provided in each layer.

The first conductive layers WL of the first layer are first conductive layers WL11, WL12, and WL13. The first conductive layers WL of the second layer are first conductive layers WL21, WL22, and WL23. The first conductive layers WL of the third layer are first conductive layers WL31, WL32, and WL33.

The second conductive layers BL of the first layer are second conductive layers BL11, BL12, and BL13. The second conductive layers BL of the second layer are second conductive layers BL21, BL22, and BL23.

The unit memory layer MU1 of the first layer is composed of the memory cells MC each provided between the first conductive layers WL11, WL12, and WL13 of the first layer and the second conductive layers BL11, BL12, and BL13 of the first layer.

The unit memory layer MU2 of the second layer is composed of the memory cells MC each provided between the second conductive layers BL11, BL12, and BL13 of the first layer and the first conductive layers WL21, WL22, and WL23 of the second layer.

The unit memory layer MU3 of the third layer is composed of the memory cells MC each provided between the first conductive layers WL21, WL22, and WL23 of the second layer and the second conductive layers BL21, BL22, and BL23 of the second layer.

The unit memory layer MU4 of the fourth layer is composed of the memory cells MC each provided between the second conductive layers BL21, BL22, and BL23 of the second layer and the first conductive layers WL31, WL32, and WL33 of the third layer.

That is, the first conductive layers WL and the second conductive layers BL between the unit memory layers MU are mutually shared. For instance, the second conductive layers BL11, BL12, and BL13 of the first layer are shared by the unit memory layer MU1 of the first layer and the unit memory layer MU2 of the second layer. The first conductive layers WL21, WL22, and WL23 of the second layer are shared by the unit memory layer MU2 of the second layer and the unit memory layer MU3 of the third layer. The second conductive layers BL21, BL22, and BL23 of the second layer are shared by the unit memory layer MU3 of the third layer and the unit memory layer MU4 of the fourth layer.

FIG. 1B shows a circuit diagram of the unit memory layer MU1 of the first layer. The memory cells MC (MC11, MC12, MC13, MC21, MC22, MC23, MC31, MC32, and MC33) are each connected between the first conductive layers WL (WL11-WL13) and the second conductive layers BL (BL11-BL13).

The memory cell MC includes a rectifying element 20 including a semiconductor layer 20s, and a variable resistance element 30 stacked with the rectifying element 20. The rectifying element 20 and the variable resistance element 30 are series connected between the first conductive layer WL and the second conductive layer BL. In the embodiment, silicon is used as an example of the semiconductor of the semiconductor layer 20s included in the rectifying element 20.

The unit memory layers MU2-MU4 of the layers other than the first layer are similarly configured as above.

However, the order of series connection of the rectifying element 20 and the variable resistance element 30 may be either the same for all the unit memory layers MU, or different for each unit memory layer MU. Furthermore, in the plurality of unit memory layers MU1-MU4, for the unit memory layers MU adjacent in the Z-axis direction (MU1 and MU2, MU2 and MU3, MU3 and MU4), the order of series connection of the rectifying element 20 and the variable resistance element 30 may be either the same or different.

In the nonvolatile storage device 110 according to the embodiment, in one unit memory layer MU, at least two adjacent memory cells MC of the plurality of memory cells MC include semiconductor layers 20s including a crystal of the same orientation. More specifically, the plurality of memory cells MC include two adjacent memory cells MC, and the semiconductor layers 20s (e.g., layers including polycrystalline silicon) in the respective rectifying elements 20 of these two memory cells MC include a crystal of the same orientation.

Figure 2:
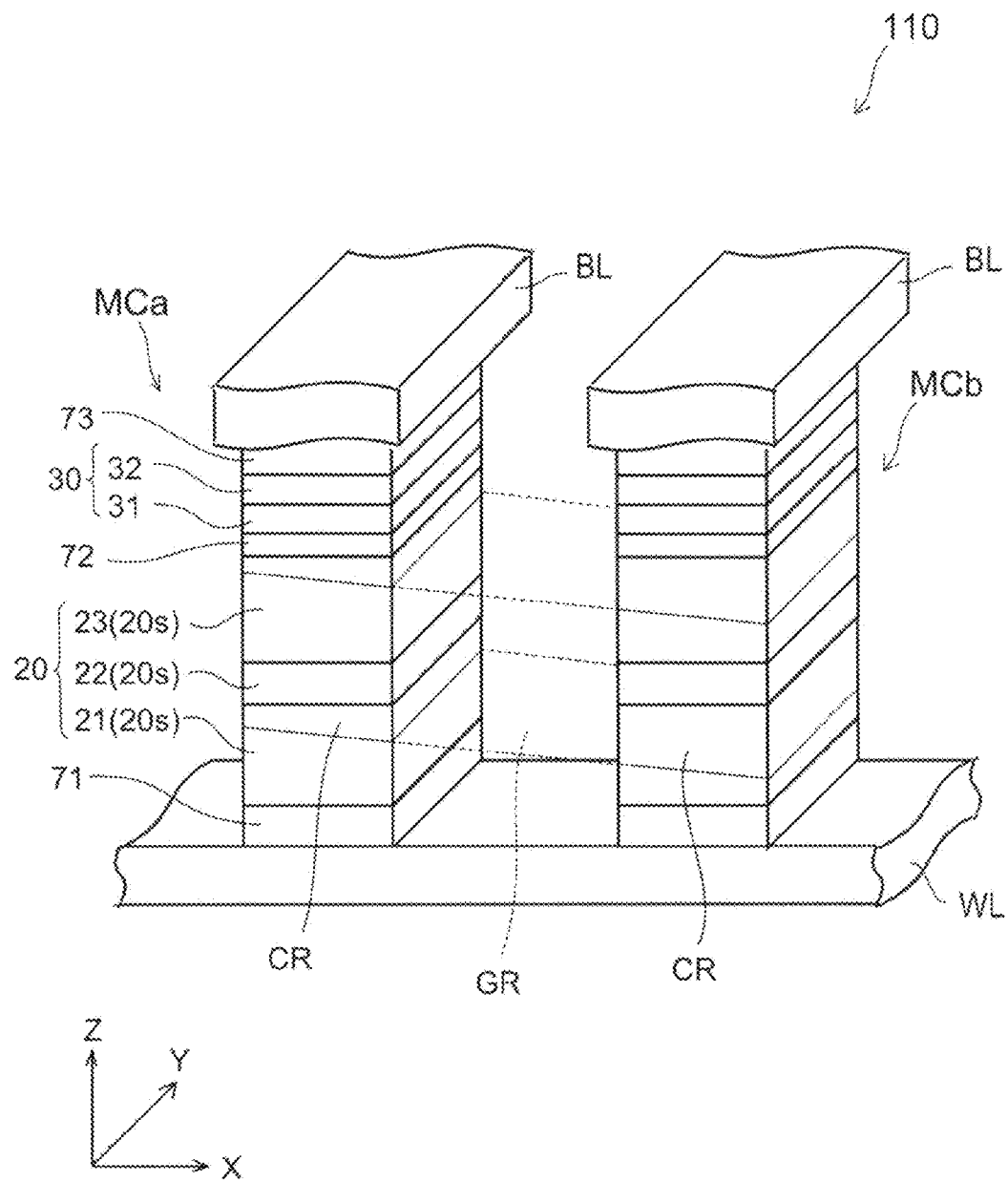
FIG. 2 is a schematic perspective view illustrating two adjacent memory cells.

FIG. 2 is a schematic perspective view illustrating two adjacent memory cells.

More specifically, FIG. 2 illustrates two adjacent memory cells MCa and MCb of the plurality of memory cells MC. As an example, the memory cells MCa and MCb are adjacent to each other along the X-axis direction.

The memory cell MC includes e.g. a first metal layer 71, a rectifying element 20, a second metal layer 72, a variable resistance element 30, and a third metal layer 73, which are sequentially stacked in the direction from the first conductive layer WL toward the second conductive layer BL along the Z axis.

The first metal layer 71 is e.g. a barrier metal layer provided between the first conductive layer WL and the rectifying element 20. The first metal layer 71 is made of e.g. titanium nitride (TiN). The third metal layer 73 is e.g. a barrier metal layer provided between the second conductive layer BL and the variable resistance element 30. The third metal layer 73 is made of e.g. TiN.

The second metal layer 72 includes e.g. TiN. The rectifying element 20 side of the second metal layer 72 includes a silicide film (e.g., $TiSi_2$). The second metal layer 72 may be entirely made of a silicide film.

The rectifying element 20 illustrated in FIG. 2 is a PIN (p-type semiconductor—intrinsic semiconductor—n-type semiconductor) diode including an n-type semiconductor layer 21, a p-type semiconductor layer 23, and an intrinsic semiconductor layer 22 formed therebetween. Besides the PIN diode, the rectifying element 20 can be based on various elements having a rectifying function, such as NIP (n-type semiconductor—intrinsic semiconductor—p-type semiconductor) diode, PN (p-type semiconductor—n-type semiconductor) diode, PIM (p-type semiconductor—intrinsic semiconductor—metal) element, NIM (n-type semiconductor— intrinsic semiconductor—metal) element, Zener diode, Schottky diode, PNP (p-type semiconductor—n-type semiconductor—p-type semiconductor) bipolar transistor, NPN (n-type semiconductor—p-type semiconductor—n-type semiconductor) bipolar transistor, PIP (p-type semiconductor—insulator—p-type semiconductor) element, PIN (p-type semiconductor—insulator—n-type semiconductor) element, NIN (n-type semiconductor—insulator—n-type semiconductor) element, PIM (p-type semiconductor—insulator—metal) element, and NIM (n-type semiconductor—insulator—metal) element.

The semiconductor included in the semiconductor layer 20s is at least one of an n-type semiconductor, a p-type semiconductor, and an intrinsic semiconductor.

The variable resistance element 30 includes a variable resistance layer 32. The variable resistance layer 32 is made of a material transitioning between a high resistance state and a low resistance state depending on the applied voltage. The variable resistance element 30 may include a high concentration layer 31 between the variable resistance layer 32 and the second metal layer 72. The impurity concentration of the high concentration layer 31 is comparable to the impurity concentration of at least one of the n-type semiconductor layer 21 and the p-type semiconductor layer 23 of the rectifying element 20. The impurity concentration of the high concentration layer 31 is e.g. $1 \times 10^{20}$ cm$^{-3}$ or more and $1 \times 10^{22}$ cm$^{-3}$ or less.

In the memory cells MCa and MCb, the semiconductor layer 20s (e.g., at least one of the n-type semiconductor layer 21, the intrinsic semiconductor layer 22, and the p-type semiconductor layer 23) of each rectifying element 20 includes a crystal CR of the same orientation. For instance, in the case where the semiconductor layer 20s of the rectifying element 20 of the memory cells MCa and MCb includes polycrystalline silicon, the polycrystalline silicon crystal CR includes a portion formed from the same crystal grain GR of silicon. During manufacturing, the memory cells MCa and MCb are formed by dividing the same crystal grain GR of silicon. Hence, the semiconductor layer 20s in the rectifying element 20 of the memory cells MCa and MCb includes a crystal CR of the same orientation.

The orientation of the crystal CR can be measured by e.g. the X-ray diffraction method, ECP (electron channeling pattern) method, and EBSD (electron backscatter diffraction pattern) method.

In the nonvolatile storage device 110 according to the embodiment, if the orientation of the crystal CR included in each rectifying element 20 of a plurality of memory cells MC is measured, the nonvolatile storage device 110 includes at least one pair of adjacent memory cells MCa and MCb including a crystal CR of the same orientation. If the rectifying elements 20 of three or more memory cells MC are formed by dividing one crystal grain CR, then by this division, the rectifying elements 20 of the three or more memory cells MC include a crystal CR of the same orientation.

The plurality of memory cells MC included in one unit memory layer may include a group of a plurality of memory cells MC including rectifying elements 20 including a crystal CR of a first orientation, and a group of a plurality of memory cells MC including rectifying elements 20 including a crystal CR of a second orientation different from the first orientation. Furthermore, in the case where the rectifying element 20 is formed from one crystal grain GR, the single rectifying element 20 may be entirely formed from a silicon monocrystal.

Thus, the memory cells MC based on rectifying elements 20 including a crystal CR of the same orientation are provided. This reduces variation in rectification characteristics.

Furthermore, the semiconductor layer 20s of each rectifying element 20 is seldom made of a small crystal grain. That is, the crystal grain is made generally large. This improves the rectification characteristics.

Next, the nonvolatile storage device 110 according to the embodiment is described in comparison with a reference example.

Figure 3:
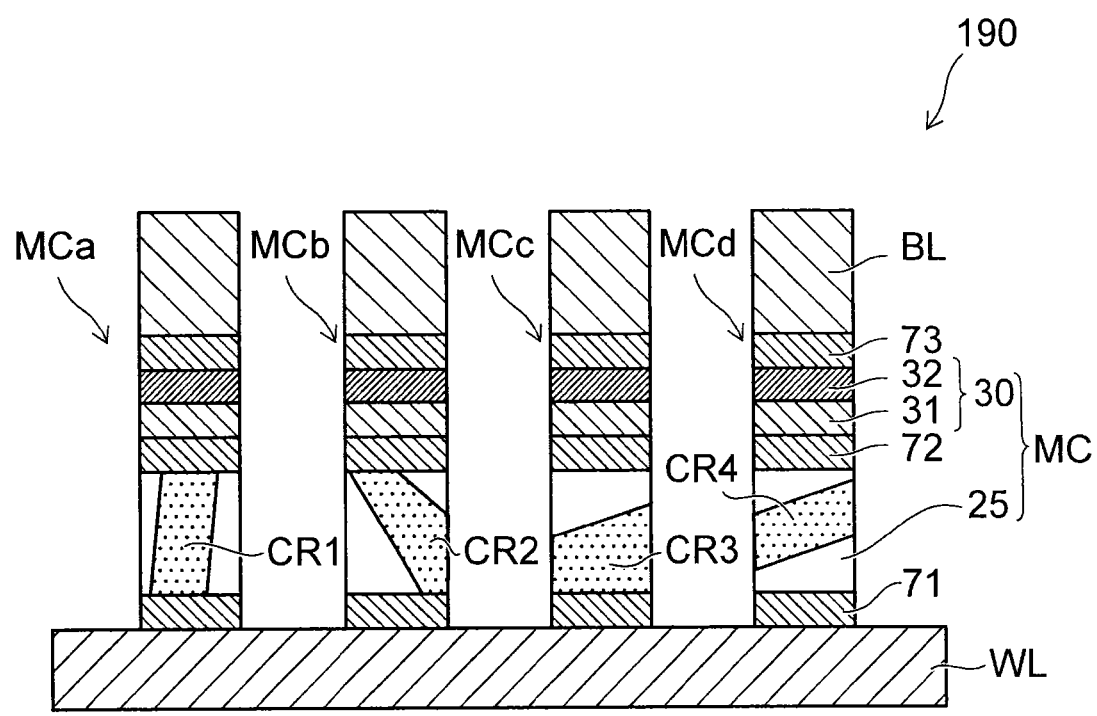
FIG. 3 is a schematic sectional view illustrating a nonvolatile storage device according to the reference example.

FIG. 3 is a schematic sectional view illustrating a nonvolatile storage device according to the reference example.

More specifically, FIG. 3 shows four memory cells MCa, MCb, MCc, and MCd adjacent in the X-axis direction of the nonvolatile storage device 190 according to the reference example. Each memory cell MC includes a rectifying element 25 and a variable resistance element 30. The rectifying element 25 is provided between a first metal layer 71 and a third metal layer 73. The variable resistance element 30 includes a high concentration layer 31, a third metal layer 73, and a variable resistance layer 32 provided between the high concentration layer 31 and the third metal layer 73.

In the nonvolatile storage device 190, the orientations of polycrystalline silicon crystals CR1, CR2, CR3, and CR4 included in the rectifying elements 25 of the respective memory cells MCa, MCb, MCc, and MCd are different.

In the nonvolatile storage device 190 according to the reference example, after division into individual memory cells MCa, MCb, MCc, and MCd, the amorphous silicon of the rectifying element 25 is crystallized. Thus, in each rectifying element 25 of the memory cells MCa, MCb, MCc, and MCd, crystallization proceeds from a different nucleus. There is a very low probability that the crystals CR1, CR2, CR3, and CR4 grown from different nuclei have the same orientation. Thus, the orientations of the polycrystalline silicon crystals CR1, CR2, CR3, and CR4 included in the rectifying elements 25 of the respective memory cells MCa, MCb, MCc, and MCd are made different. Furthermore, because crystal growth proceeds from different nuclei, the diameters (grain diameters) of the polycrystalline silicon crystals CR1, CR2, CR3, and CR4 included in the rectifying elements 25 of the respective memory cells MCa, MCb, MCc, and MCd are made generally small.

Figure 4A:
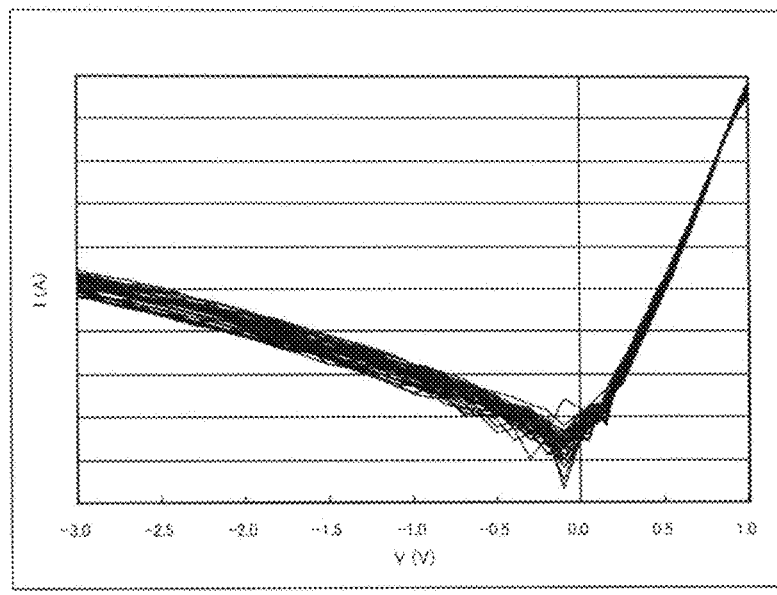
FIGS. 4A and 4B illustrate the characteristics of rectifying elements.
Figure 4B:
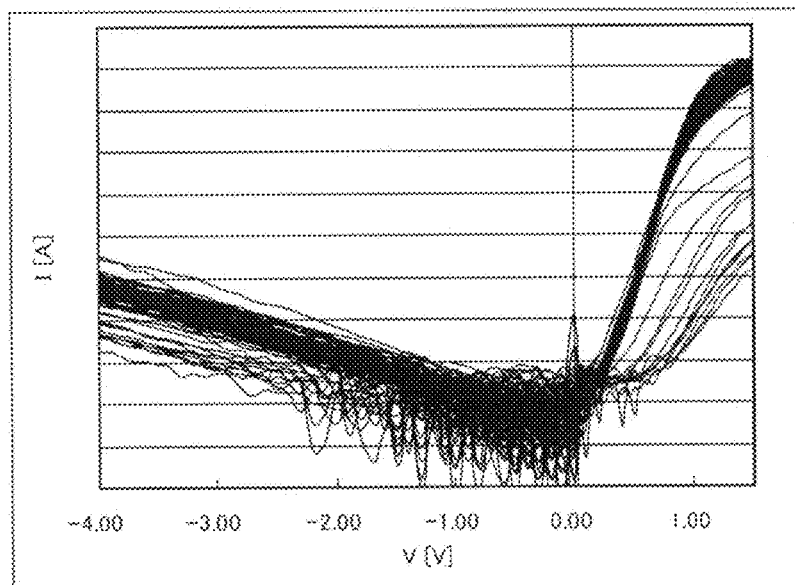

FIGS. 4A and 4B illustrate the characteristics of rectifying elements.

FIG. 4A illustrates the characteristics of a rectifying element with an outline measuring 250 nanometers (nm) per side as viewed in the Z-axis direction. FIG. 4B illustrates the characteristics of a rectifying element with an outline measuring 40-45 nm per side as viewed in the Z-axis direction. The characteristics illustrated in FIG. 4B are the characteristics of the rectifying element 25 provided in the memory cell MC of the nonvolatile storage device 190 according to the reference example shown in FIG. 3.

In FIGS. 4A and 4B, the horizontal axis represents voltage, and the vertical axis represents current.

As shown in FIGS. 4A and 4B, if the outline of the rectifying element as viewed in the Z-axis direction is relatively large, the rectification characteristics of the rectifying element are stabilized. In the rectifying element 25 provided in the memory cell MC of the nonvolatile storage device 190 according to the reference example shown in FIG. 4B, when amorphous silicon is crystallized, the rectifying elements 20 of the memory cells MC are made uneven in the surface orientation of the crystals CR1, CR2, CR3, and CR4. Furthermore, with the decrease of the volume of the rectifying element 20, the existence probability of a crystal nucleus included in the rectifying element 20 decreases. This results in insufficient crystallization, and rectifying elements 20 having a small current value occur. Thus, variations occur in the rectification characteristics of the rectifying elements 20.

In the rectifying element 20 based on e.g. silicon, the crystal grain in each memory cell MC is independently formed. Thus, there is no consistency in crystal orientation. Hence, in the nonvolatile storage device 190 according to the reference example, there is virtually no case where the crystals of the rectifying elements 20 in two adjacent memory cells MC have the same surface orientation.

The variation in the crystal orientation of the rectifying elements 20 among the memory cells MC results in a large variation in the characteristics of the rectifying elements 20 of the memory cells MC in the nonvolatile storage device 190. For instance, if the outline of the rectifying element 20 as viewed in the Z-axis direction is miniaturized to a size of approximately 50 nm or less, there may be a case where the region of the rectifying element 20 includes no nucleus for crystallization. This may cause degradation in the rectification characteristics due to non-crystallization of the rectifying element 20. Furthermore, even if crystallized, a rectifying element 20 including a fine crystal may occur. This increases variations in the current value of the memory cells MC. One of the causes of this phenomenon is the variation in the number of crystal grain boundaries and crystal defects.

Figure 5A:
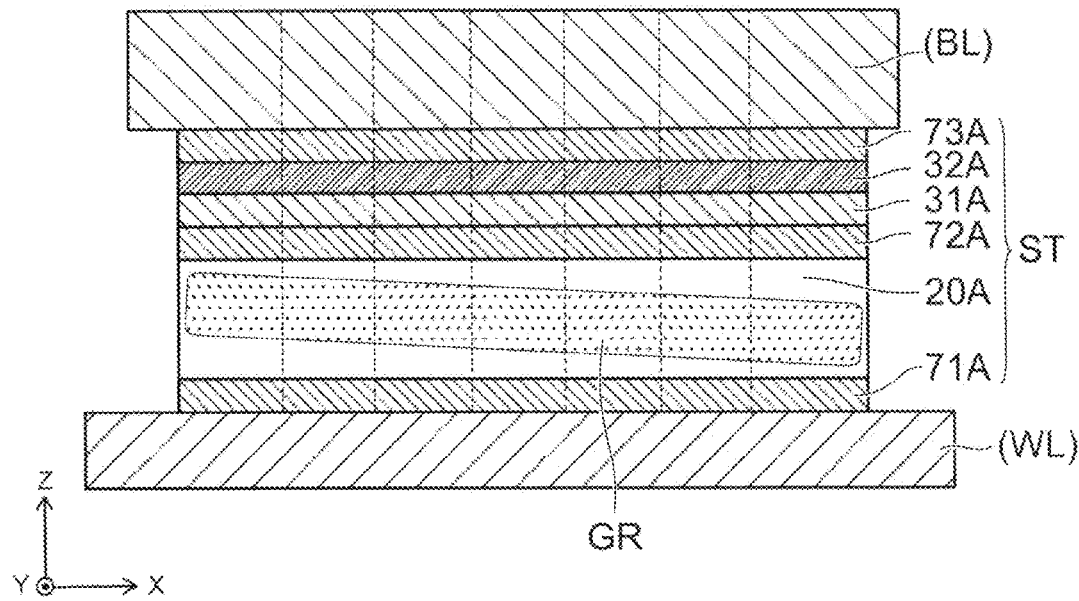
FIGS. 5A and 5B are schematic sectional views illustrating the memory cells of the nonvolatile storage device according to the embodiment.
Figure 5B:
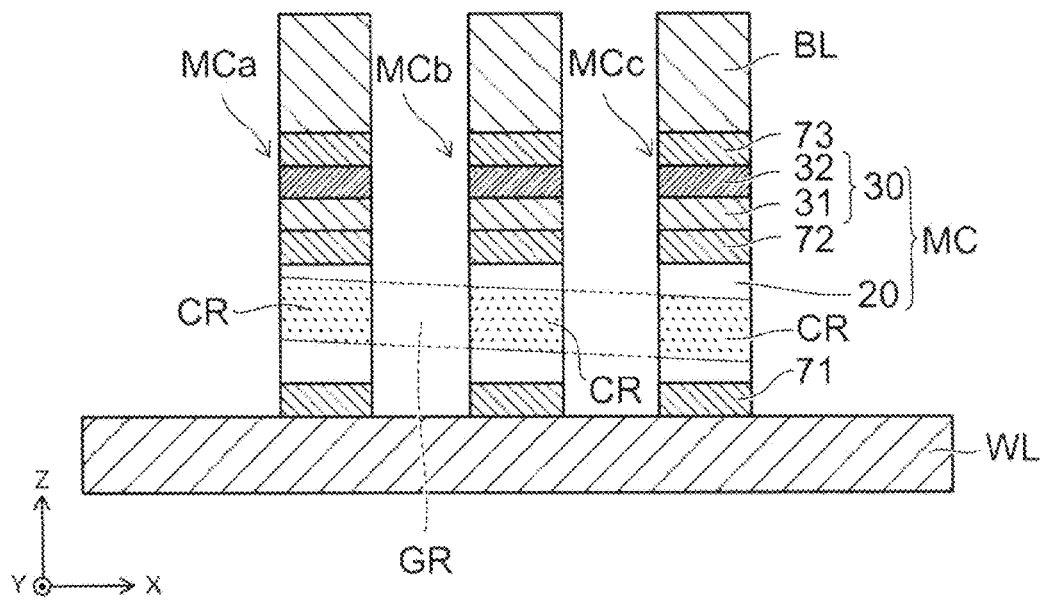

FIGS. 5A and 5B are schematic sectional views illustrating the memory cells of the nonvolatile storage device according to the embodiment.

FIG. 5A illustrates the stacked body before processing. FIG. 5B illustrates the stacked body after processing.

As shown in FIG. 5A, the stacked body ST includes a first metal layer material film 71A, a rectifying element material film 20A, a second metal layer material film 72A, a high concentration semiconductor film 31A, a variable resistance material film 32A, and a third metal layer material film 73A, which are sequentially stacked in the direction from the film constituting the first conductive layer WL toward the film constituting the second conductive layer BL. The rectifying element material film 20A includes an amorphous silicon film. The rectifying element material film 20A is crystallized by heating before processing the stacked body ST. That is, in the rectifying element material film 20A, a polycrystalline grain GR of the semiconductor (e.g., silicon) included in the amorphous silicon film is formed.

As shown in FIG. 5B, by patterning for removing part of the stacked body ST along the Z-axis direction, the stacked body ST is divided into individual memory cells MCa, MCb, and MCc. In dividing the stacked body ST, the crystal grain GR previously formed in the rectifying element material film 20A is divided. The divided crystal grain GR is included as a crystal CR in the rectifying element 20 of the individual memory cells MCa, MCb, and MCc. The crystals CR belonging to the same crystal grain GR have the same orientation. Hence, the crystals CR included in the rectifying elements 20 of the memory cells MCa, MCb, and MCc have the same surface orientation.

Figure 6:
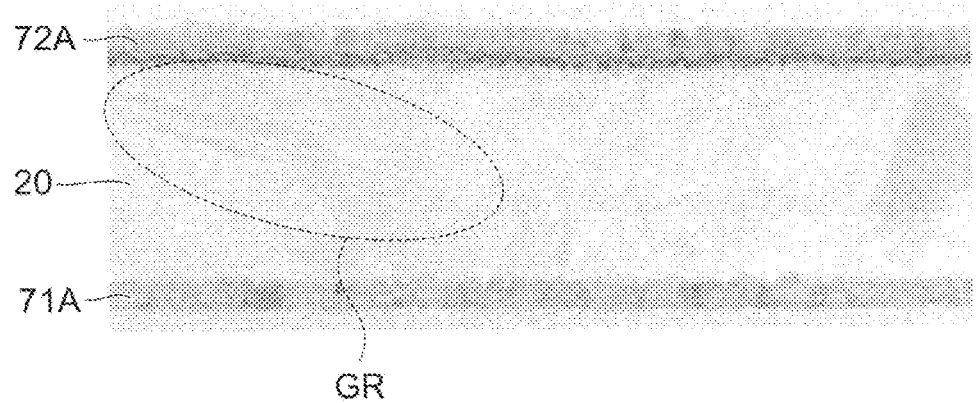
FIG. 6 is a sectional view illustrating the crystal grain of the semiconductor material film.

FIG. 6 is a sectional view illustrating the crystal grain of the semiconductor material film.

More specifically, FIG. 6 shows a TEM (transmission electron microscopy) image of the semiconductor material film after crystallization. By performing e.g. RTA (rapid thermal annealing) on the amorphous silicon film, a crystal grain CR is formed over a wide range of the rectifying element material film 20A.

FIGS. 7 to 10 are sectional views illustrating the stacked body after processing.

Figure 7:
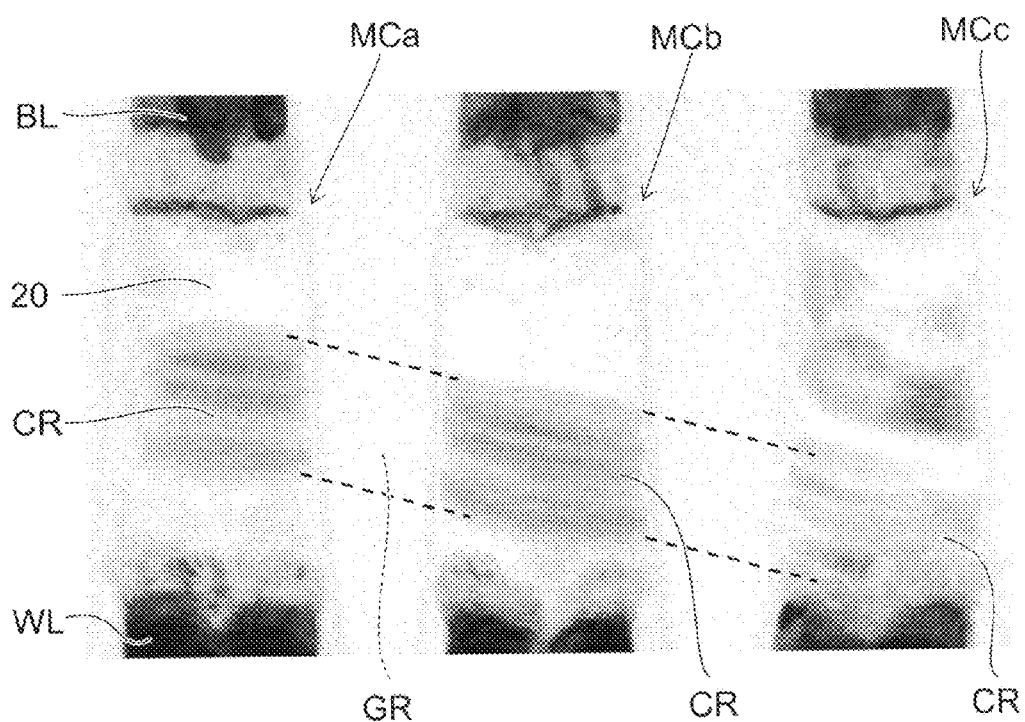
FIGS. 7 to 10 are sectional views illustrating the stacked body after processing.
Figure 8:
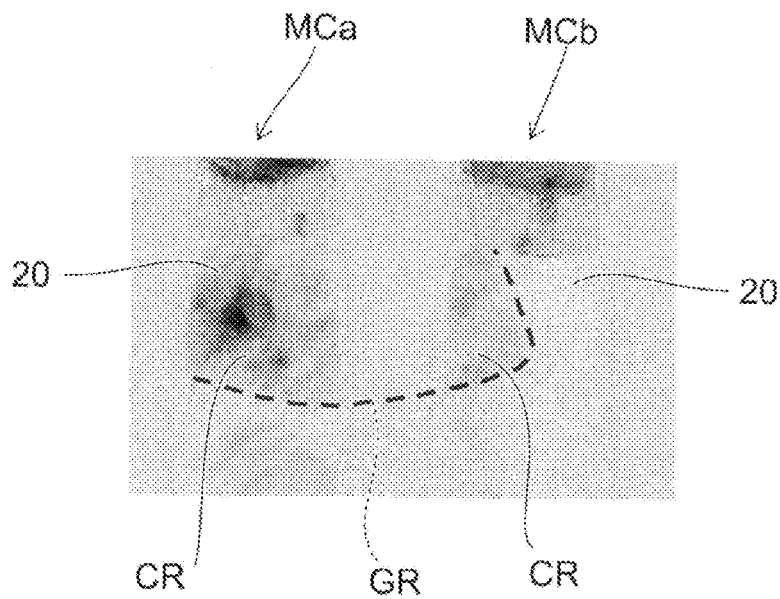
Figure 9:
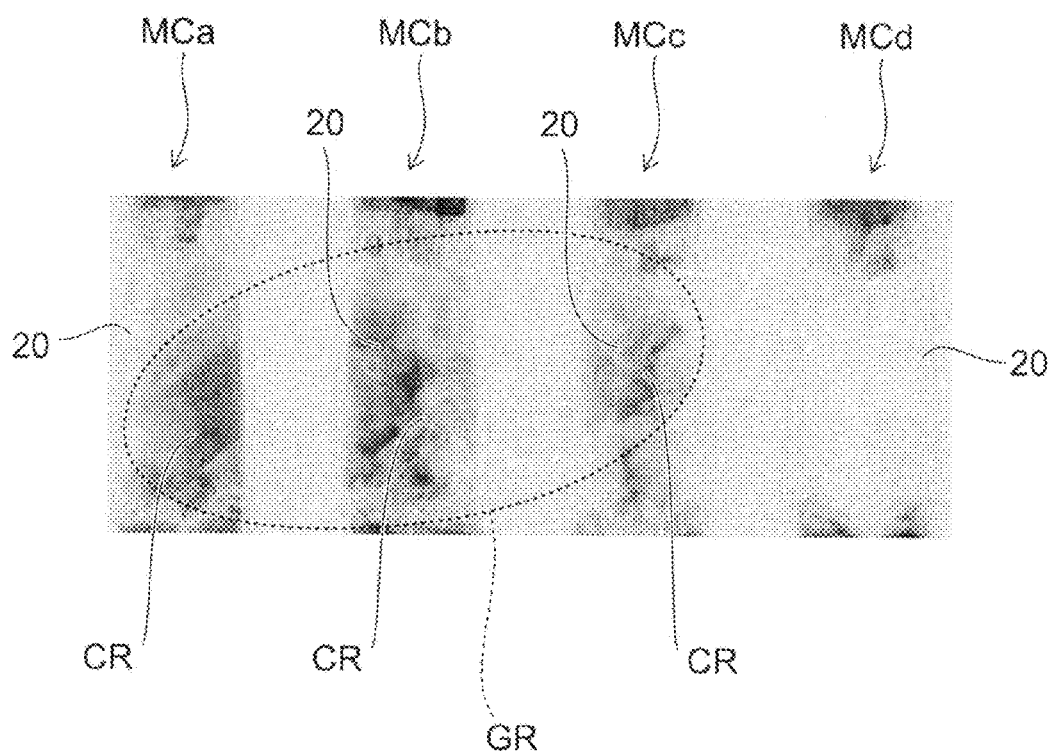
Figure 10:
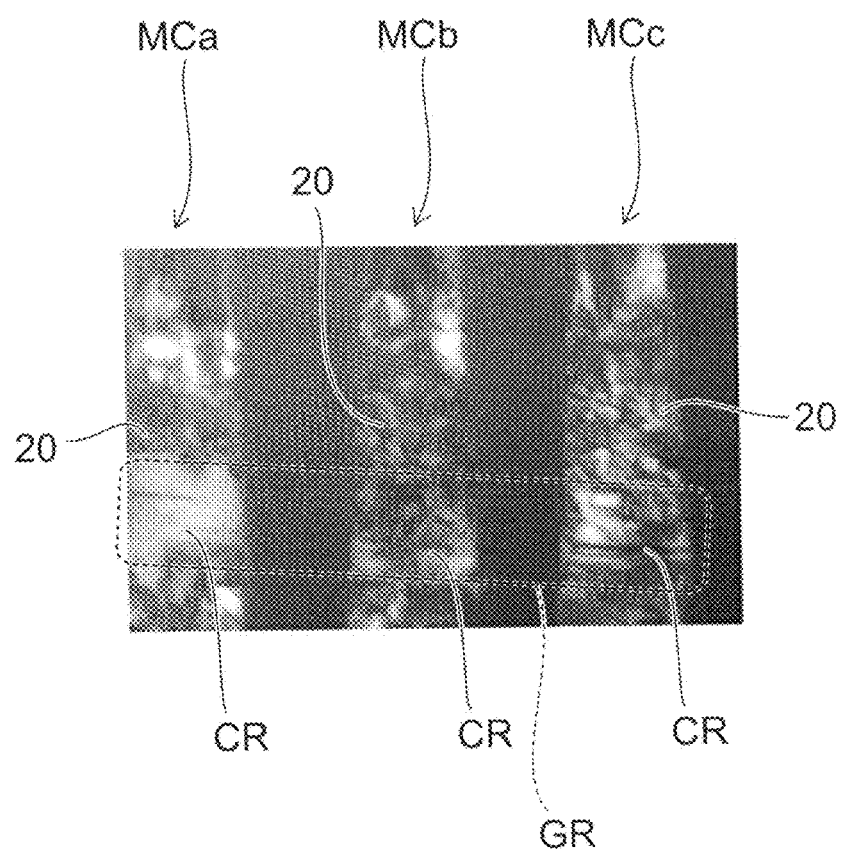

FIGS. 7 to 9 show TEM images of the stacked body after being processed into individual memory cells. FIG. 10 shows a dark field image of the memory cells.

As shown in FIG. 7, part of the stacked body is removed to form individual memory cells MCa, MCb, and MCc. Then, in each rectifying element 20, a crystal CR divided from the same crystal grain GR is left. In the TEM image, the crystal CR of the memory cells MCa, MCb, and MCc appears as a striped pattern. In the adjacent crystals CR formed from the same crystal grain GR, the striped patterns appear on the same extension line.

As shown in FIG. 8, in two adjacent memory cells MCa and MCb, the crystals CR included in the respective rectifying elements 20 are divided from the same crystal grain GR. In the example shown in FIG. 9, of the four memory cells MCa, MCb, MCc, and MCd arranged in a prescribed direction, three memory cells MCa, MCb, and MCc include a crystal CR divided from the same crystal grain GR.

Thus, in the case where at least two memory cells MC include crystals CR belonging to the same crystal grain GR, it is found that they are crystallized by heating before processing the stacked body ST, and subsequently divided into individual memory cells MC.

As shown in FIG. 10, the continuity (of the crystal orientation and the like) of the crystals CR in the memory cells MC is confirmed also by the dark field image. In the example shown in FIG. 10, it is found that in three adjacent memory cells MC, the respective striped patterns lie on the same extension line.

Thus, if striped patterns appear on the same extension line in the crystals CR included in the rectifying elements 20 of adjacent memory cells, it is found that the crystals CR are formed from the same crystal grain GR. That is, by confirming such striped patterns, it is found that the rectifying elements 20 of adjacent memory cells include a crystal CR of the same orientation.

Figure 11:
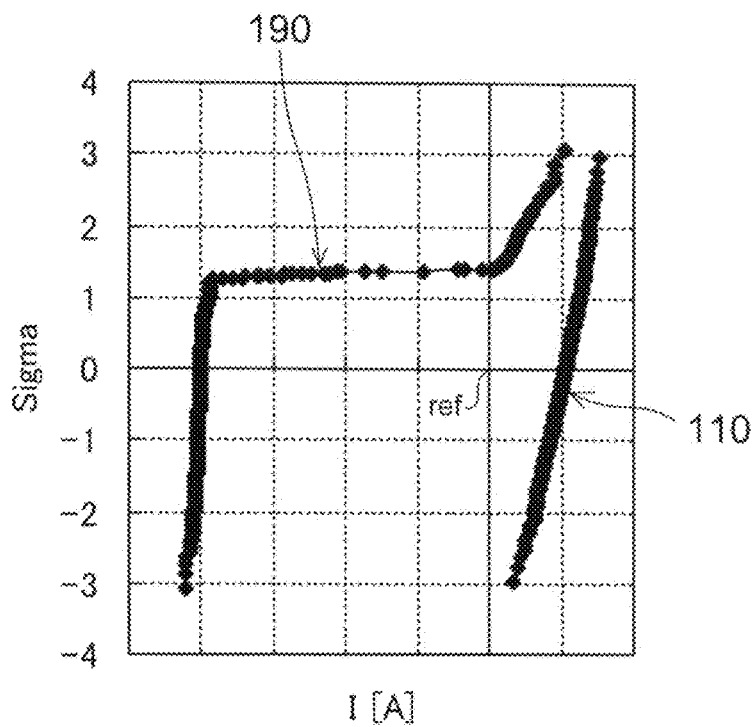
FIG. 11 illustrates the characteristics of the rectifying elements used in the nonvolatile storage device according to the embodiment.

FIG. 11 illustrates the characteristics of the rectifying elements used in the nonvolatile storage device according to the embodiment.

In FIG. 11, the relationship between the forward current and the standard deviation of the rectifying elements is shown as a scatter diagram. In FIG. 11, the horizontal axis represents the forward current, and the vertical axis represents the standard deviation. On the horizontal axis, the reference current ref is indicated. FIG. 11 illustrates the characteristics of the rectifying elements used in the nonvolatile storage device 110 according to the embodiment, and the characteristics of the rectifying elements used in the nonvolatile storage device 190 according to the reference example.

The rectifying elements used in the nonvolatile storage device 110 according to the embodiment largely include a crystal CR of the same orientation. Hence, compared with the rectifying elements used in the nonvolatile storage device 190 according to the reference example, the variation of the forward current is smaller. That is, the rectification characteristics of the rectifying elements allowing passage of the forward current exceeding the reference current ref can be made more uniform in the nonvolatile storage device 110 according to the embodiment than in the nonvolatile storage device 190 according to the reference example.

This advantage is achieved more significantly in a finer cell array such that the half pitch of the memory cell MC is made smaller than e.g. 30 nm. Hence, it is effective for miniaturization of the memory cell MC.

Second Embodiment

The second embodiment is an example method for manufacturing a nonvolatile storage device.

Figure 12:
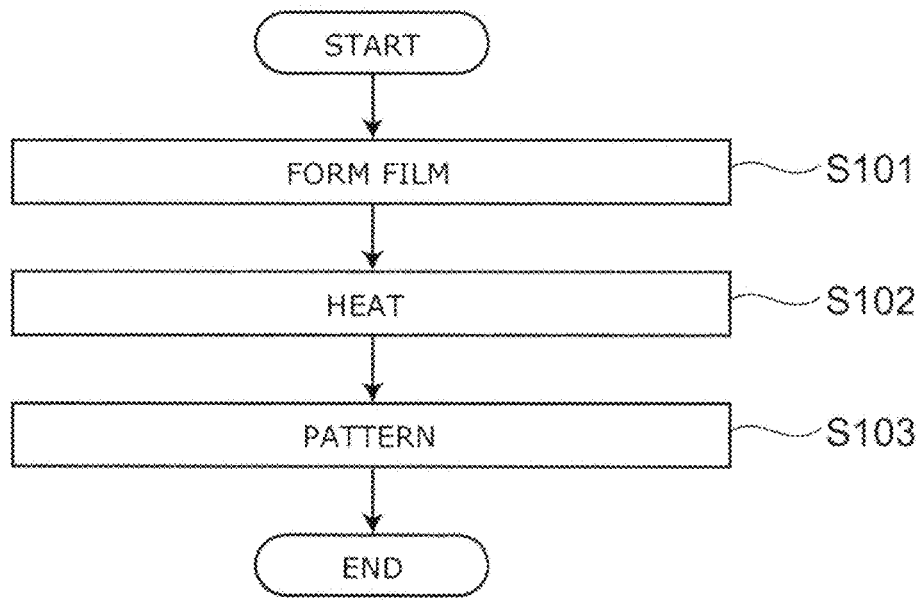
FIG. 12 is a flow chart illustrating the flow of a method for manufacturing a nonvolatile storage device according to the embodiment.

FIG. 12 is a flow chart illustrating the flow of a method for manufacturing a nonvolatile storage device according to the embodiment.

As shown in FIG. 12, the method for manufacturing a nonvolatile storage device according to the embodiment includes a film formation step (step S101), a heating step (step S102), and a patterning step (step S103).

The film formation step (step S101) forms a rectifying element material film 20A including an amorphous silicon film and constituting a rectifying element 20.

The heating step (step S102) heats the rectifying element material film 20A to form a crystal grain of a semiconductor included in a polycrystalline silicon film.

The patterning step (step S103) patterns the rectifying element material film 20A into a rectifying element 20 including a semiconductor layer 20s.

FIGS. 13A to 14D are schematic sectional views describing a first specific example of the method for manufacturing a nonvolatile storage device.

FIGS. 13A to 13D show the state in each manufacturing step as a schematic sectional view as viewed in the X-axis direction. FIGS. 14A to 14D are schematic sectional views illustrating the A-A cross section of FIGS. 13A to 13D.

Figure 13A:
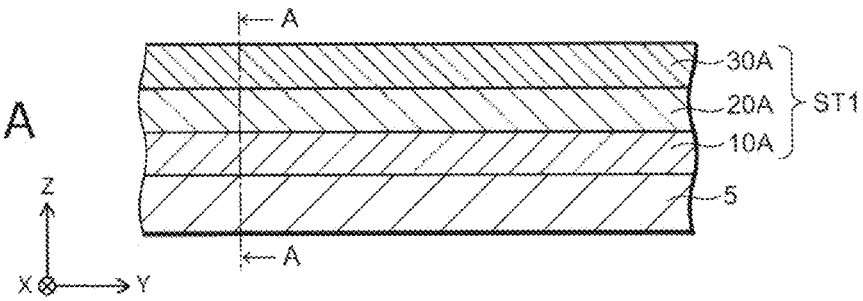
FIGS. 13A to 14D are schematic sectional views describing a first specific example of the method for manufacturing a nonvolatile storage device.
Figure 14A:
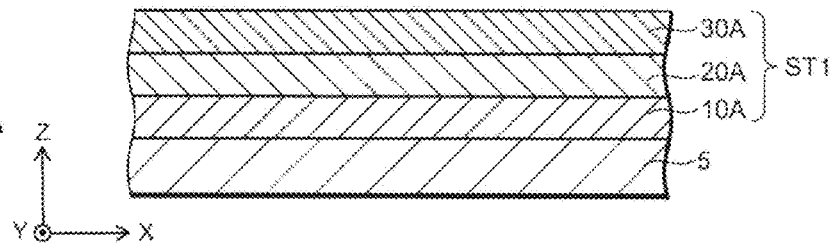

First, as shown in FIGS. 13A and 14A, on the major surface of a substrate 5, a first conductive layer material film 10A, a rectifying element material film 20A, and a memory film 30A are stacked in this order from bottom to form a stacked body ST1. The first conductive layer material film 10A is made of e.g. tungsten (W). The rectifying element material film 20A includes e.g. a p-type semiconductor material and an n-type semiconductor material. The formed rectifying element material film 20A includes an amorphous semiconductor. In the specific example, amorphous silicon is taken as an example of the amorphous semiconductor.

The memory film 30A is made of e.g. metal oxide or organic material. The memory film 30A may include a high concentration semiconductor material film (a film constituting the high concentration layer 31 shown in FIG. 2) having a relatively high n-type impurity concentration or p-type impurity concentration.

These films can be formed by various film formation methods such as the sputtering method and CVD (chemical vapor deposition) method.

In order to form amorphous silicon, formation of the rectifying element material film 20A is performed at a temperature of e.g. 400° C. or more and 530° C. or less. Here, in forming the rectifying element material film 20A, the film formation may be performed at a temperature temporarily exceeding 600° C. Then, silicon microcrystals are formed in part of the amorphous silicon film. This can accelerate the crystallization performed in a later step.

For instance, in forming the rectifying element material film 20A, when the portion corresponding to the I-layer (intrinsic layer) of the rectifying element 20 made of a PIN diode is formed, film formation is performed at a temperature temporarily exceeding 600° C. Then, when the amorphous silicon film is turned into a polycrystalline silicon film in a later step, crystallization proceeds from the portion corresponding to the I-layer. Thus, a rectifying element 20 with stable characteristics can be formed.

Likewise, in order to accelerate the crystallization of the amorphous silicon film, in addition to the step of performing film formation at a temperature temporarily exceeding 600° C. in forming the rectifying element material film 20A as described above, the step of adding a material acting as a crystal nucleus may be performed in the film formation. For instance, in forming an amorphous silicon film, germanium (Ge), for instance, is added in a proportion of approximately 30% or less. Then, when the amorphous silicon film is crystallized in a later step, the crystallization can be accelerated by e.g. Ge acting as a crystal nucleus.

Here, formation of the amorphous silicon film by complete crystallization may cause roughened surface morphology. For instance, film formation with a thickness of approximately 100 nm may result in unevenness to 10-20%. Such unevenness causes variation in device performance. In this case, it is difficult to operate the memory cells at the same voltage. In particular, in the case of a cross-point nonvolatile storage device, rectifying elements are used to select selected cells, half-selected cells, and non-selected cells. Hence, variation in characteristics makes accurate selection difficult. These reasons favor the manufacturing method in which a crystal nucleus is added to the amorphous silicon film.

In forming the stacked body ST1, between the first conductive layer material film 10A and the rectifying element material film 20A, a metal material film (a film constituting the first metal layer 71 shown in FIG. 2) made of e.g. titanium nitride (TiN) is formed. Furthermore, on the memory film 30A, a metal material film (a film constituting the third metal layer 73 shown in FIG. 2) made of e.g. TiN is formed.

Furthermore, between the rectifying element material film 20A and the memory film 30A, a metal material film (a film constituting the second metal layer 72 shown in FIG. 2) for silicide film formation is formed. The metal material film for silicide film formation is e.g. a monolayer film or a multilayer film having composition variation based on group 3d or higher atoms. The film thickness of the metal material film for silicide film formation is e.g. 1 nm or more and 3 nm or less. By such film thickness, the metal material film for silicide film formation can suppress the occurrence of spiking (or piping) of the metal component into the semiconductor layer (silicon) of the rectifying element 20 and extreme agglomeration during silicidation.

Furthermore, between the metal material film for silicide film formation and the memory film 30A, a metal nitride film (e.g., TiN or WN) may be provided. The film thickness of the metal nitride film is preferably 3 nm or more. By such film thickness, the metal nitride film can serve to reinforce the metal material film for silicide film formation when the metal material film is thinned (to e.g. 1 nm or more and 3 nm or less). Furthermore, during silicidation, migration of the metal component of the metal material film into the semiconductor layer (silicon) of the rectifying element 20 is made difficult.

This can further enhance the effect of suppressing the occurrence of piping of the metal component into the semiconductor layer of the rectifying element 20 and extreme agglomeration.

As described above, crystallization of the amorphous silicon film can be accelerated. Thus, in providing a silicide film, the film thickness of the metal material film can be thinned. This can suppress the thickness of the formed memory cell MC, and reduce the aspect ratio (e.g., the ratio of the height along the Z-axis direction to the width along the X-axis direction) of the memory cell MC.

Next, heating treatment is performed on the rectifying element material film 20A. The heating treatment is annealing (e.g., RTA) at a temperature capable of forming a crystal grain GR in the film. The annealing temperature is e.g. 725° C. or more and 800° C. or less. This heating treatment advances crystallization of silicon in the amorphous silicon included in the rectifying element material film 20A, and produces e.g. polycrystalline silicon. As shown in FIG. 5A, in the rectifying element material film 20A, a silicon crystal grain GR is formed so as to spread in the film.

Here, a metal material film for silicide film formation may have been formed between the rectifying element material film 20A and the memory film 30A. In this case, after forming this metal material film, if annealing for the crystallization of the rectifying element material film 20A is performed, the metal material film is silicidized and turned into a silicide film. Furthermore, in the case where a high concentration semiconductor material film has been formed, the high concentration semiconductor material film is crystallized by this annealing. By one-time annealing, the crystallization of the rectifying element material film 20A, the silicidation of the metal material film, and the crystallization of the high concentration semiconductor material film can be performed.

Figure 13B:
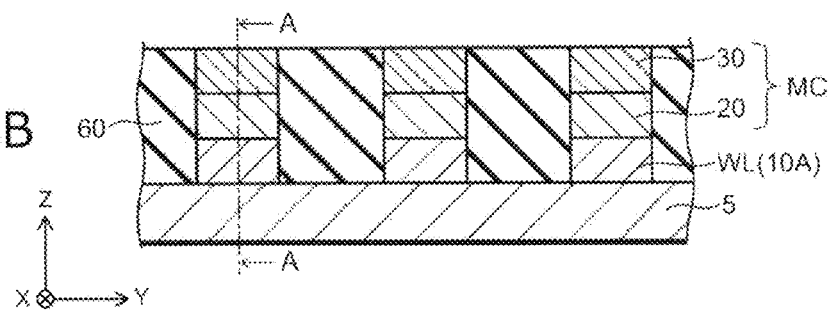
Figure 14B:
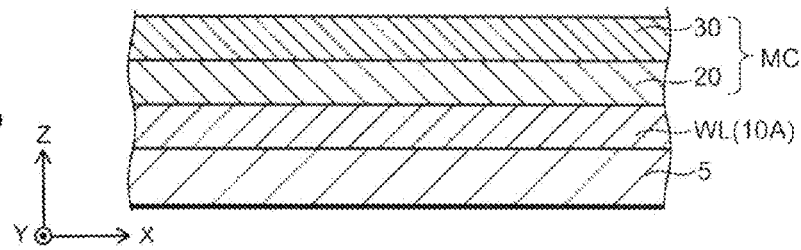

Next, as shown in FIGS. 13B and 14B, on the aforementioned stacked body ST1, a suitable etching mask is provided by the photolithography technique. Then, by the etching technique, etching processing is performed on the stacked body ST1 so as to obtain strip shapes extending in the X-axis direction. The etching is performed to the depth of the interface between the substrate 5 and the first conductive layer material film 10A. By this etching, the first conductive layer material film 10A is turned into strip-shaped first conductive layers WL extending in the X-axis direction.

Then, by the photolithography technique and etching technique, etching processing is performed to divide the strip-shaped rectifying element material film 20A and memory film 30A extending in the X-axis direction. The etching is performed to the depth of the interface between the first conductive layer WL and the rectifying element material film 20A. By this etching, on the first conductive layer WL, a pillar-shaped memory cell MC (the stacked structure of a rectifying element 20 and a variable resistance element 30) is formed.

After the etching, the space formed by the etching is filled with an interlayer insulating film 60. The upper surface of the interlayer insulating film 60 is planarized by e.g. CMP (chemical mechanical polishing). At the upper surface of the interlayer insulating film 60, the upper surface of the variable resistance element 30 is exposed.

Figure 13C:
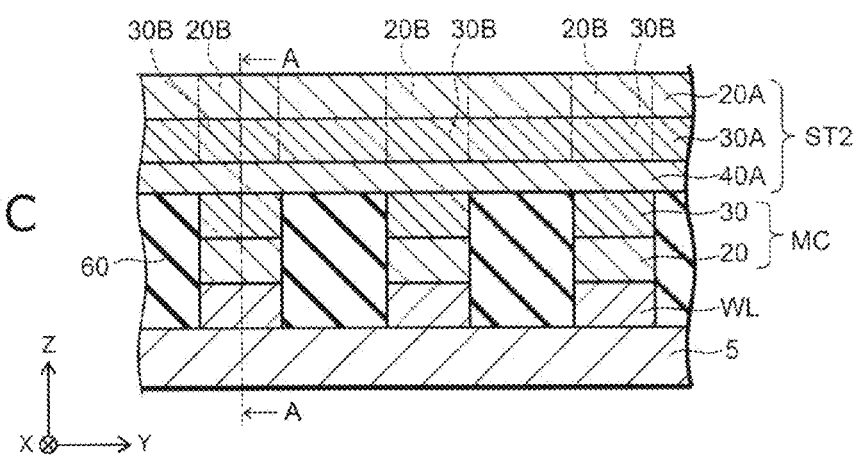
Figure 14C:
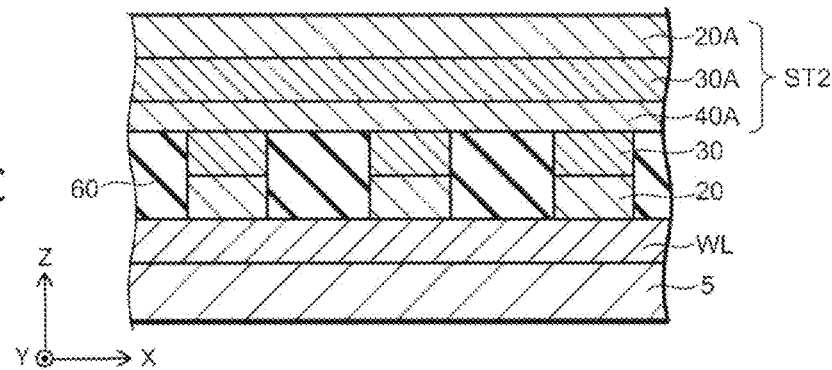

Next, as shown in FIGS. 13C and 14C, on the interlayer insulating film 60, a second conductive layer material film 40A, a rectifying element material film 20A, and a memory film 30A are stacked in this order from bottom to form a stacked body ST2. The second conductive layer material film 40A is made of e.g. W. The stacked body ST2 has the same configuration as the stacked body ST1 except that the stacking order is reversed. However, the stacked body ST2 may be configured in the same stacking order as the stacked body ST1. Furthermore, like the foregoing, formation of the rectifying element material film 20A may be performed at a temperature temporarily exceeding 600° C., or performed with the addition of e.g. Ge.

Next, heating treatment is performed on the rectifying element material film 20A. Like the foregoing, the heating treatment is annealing (e.g., RTA) at a temperature capable of forming a crystal grain GR in the film. The annealing temperature is e.g. 725° C. or more and 800° C. or less. This heating treatment advances crystallization in the amorphous silicon included in the rectifying element material film 20A, and produces e.g. polycrystalline silicon. As shown in FIG. 5A, in the rectifying element material film 20A, a crystal grain GR is formed so as to spread in the film.

Figure 13D:
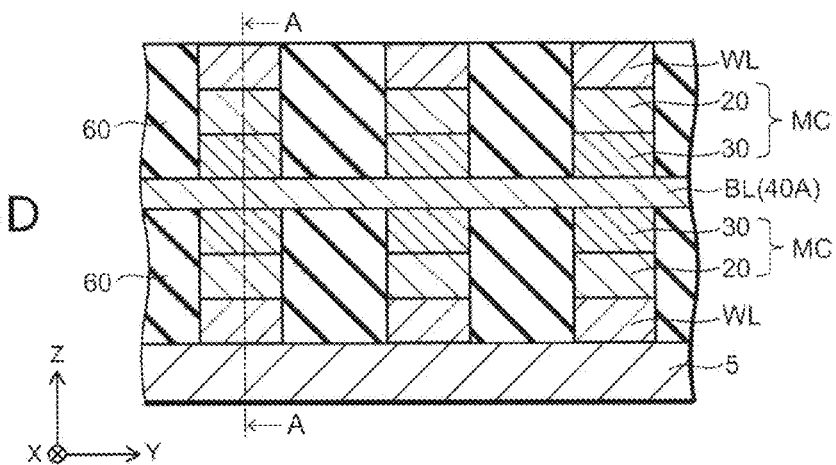
Figure 14D:
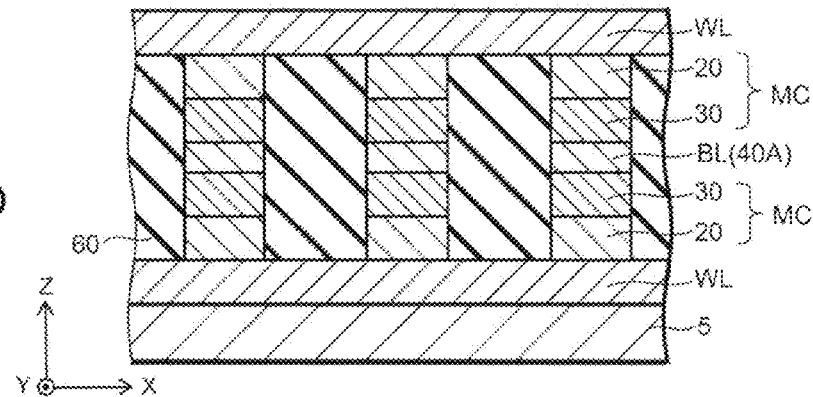

Next, as shown in FIGS. 13D and 14D, on the aforementioned stacked body ST2, a suitable etching mask is provided by the photolithography technique. Then, by the etching technique, etching processing is performed on the stacked body ST2 so as to obtain strip shapes extending in the Y-axis direction. The etching is performed to the depth of the interface between the interlayer insulating film 60 and the second conductive layer material film 40A. By this etching, the second conductive layer material film 40A is turned into strip-shaped second conductive layers BL extending in the Y-axis direction. The memory film 30A on the second conductive layer BL is turned into a strip-shaped memory film 30B extending in the Y-axis direction. The rectifying element material film 20A on the strip-shaped memory film 30B is turned into a strip-shaped rectifying element material film 20B extending in the Y-axis direction.

Then, by the photolithography technique and etching technique, etching processing is performed to divide the strip-shaped memory film 30B and strip-shaped rectifying element material film 20B extending in the Y-axis direction. The etching is performed to the depth of the interface between the second conductive layer BL and the strip-shaped memory film 30B. By this etching, on the second conductive layer BL, a pillar-shaped memory cell MC (the stacked structure of a variable resistance element 30 and a rectifying element 20) is formed.

After the etching, the space formed by the etching is filled with an interlayer insulating film 60. The upper surface of the interlayer insulating film 60 is planarized by e.g. CMP. On the rectifying element 20 exposed at the upper surface of the interlayer insulating film 60, a first conductive layer WL extending in the X-axis direction is formed.

By the process so far, two layers of memory cells MC are formed in the Z-axis direction. By repeating similar processing, three or more layers of memory cells MC can be formed. Formation of only one layer of memory cells MC can be performed by omitting the formation of the layers above the second conductive layer BL shown in FIGS. 13D and 14D.

In the above process, before etching the stacked bodies ST1 and ST2 to form memory cells MC, the rectifying element material film 20A is crystallized to form a crystal grain GR spread in the film. Thus, this process can manufacture a nonvolatile storage device in which the rectifying elements 20 of adjacent memory cells MC include a crystal CR of the same orientation.

FIGS. 15A to 18B are schematic sectional views describing a second specific example of the method for manufacturing a nonvolatile storage device.

Figure 15A:
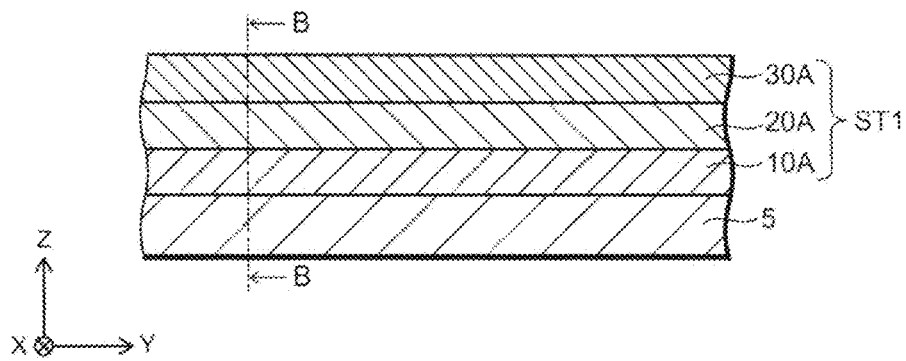
FIGS. 15A to 18B are schematic sectional views describing a second specific example of the method for manufacturing a nonvolatile storage device.
Figure 15B:
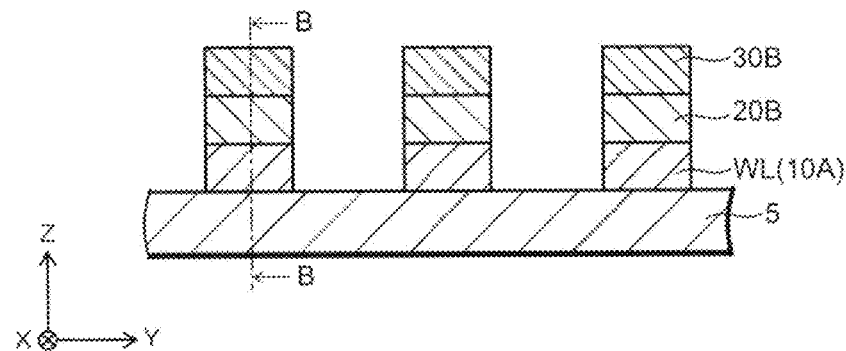
Figure 15C:
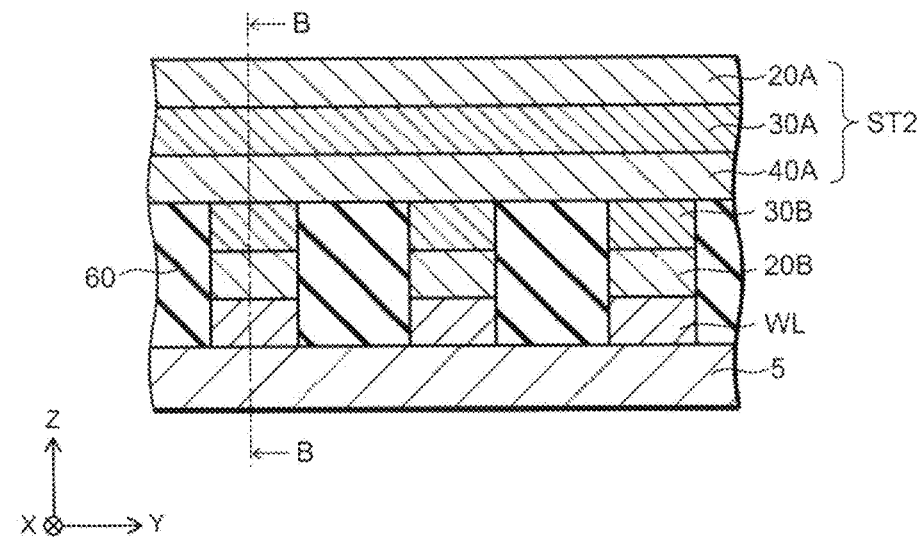
Figure 16A:
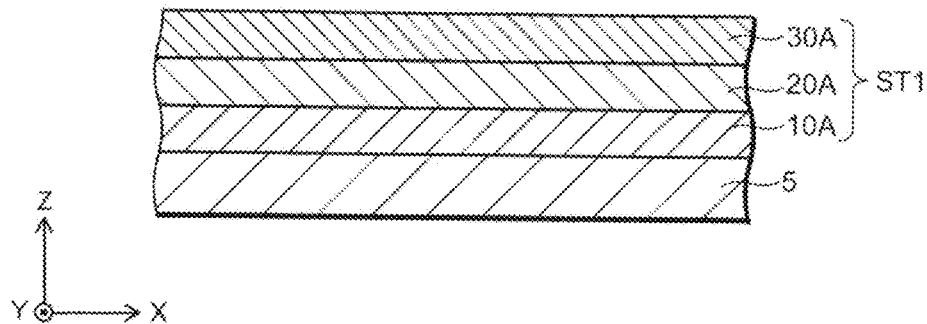
Figure 16B:
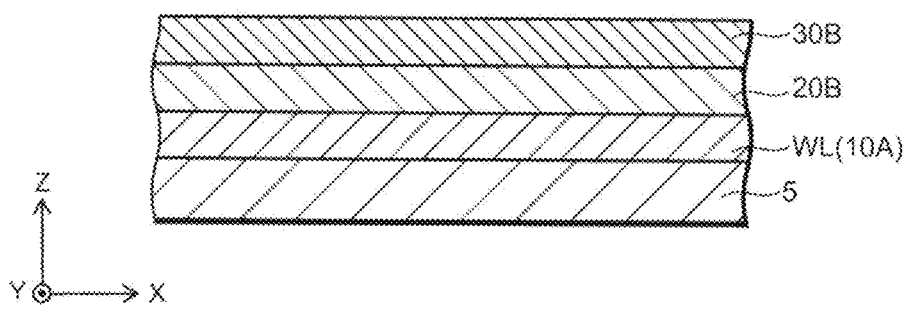
Figure 16C:
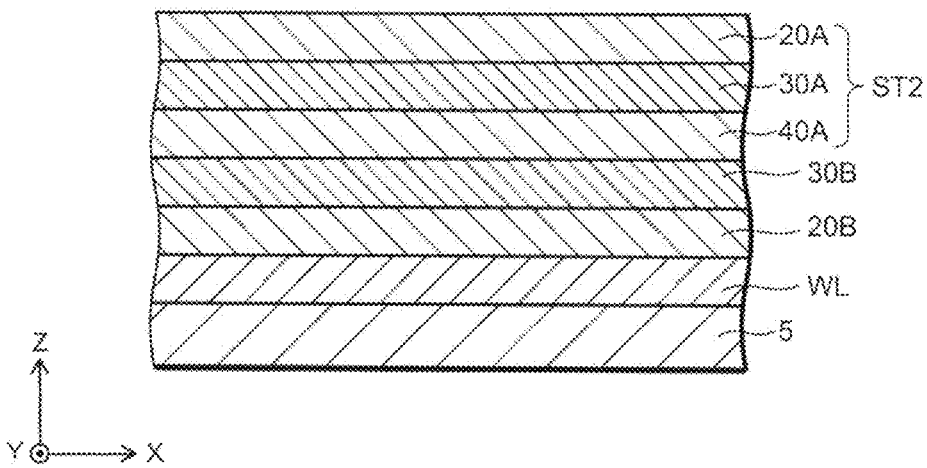

FIGS. 15A to 15C show the state in each manufacturing step as a schematic sectional view as viewed in the X-axis direction. FIGS. 16A to 16C are schematic sectional views illustrating the B-B cross section of FIGS. 15A to 15C.

Figure 17A:
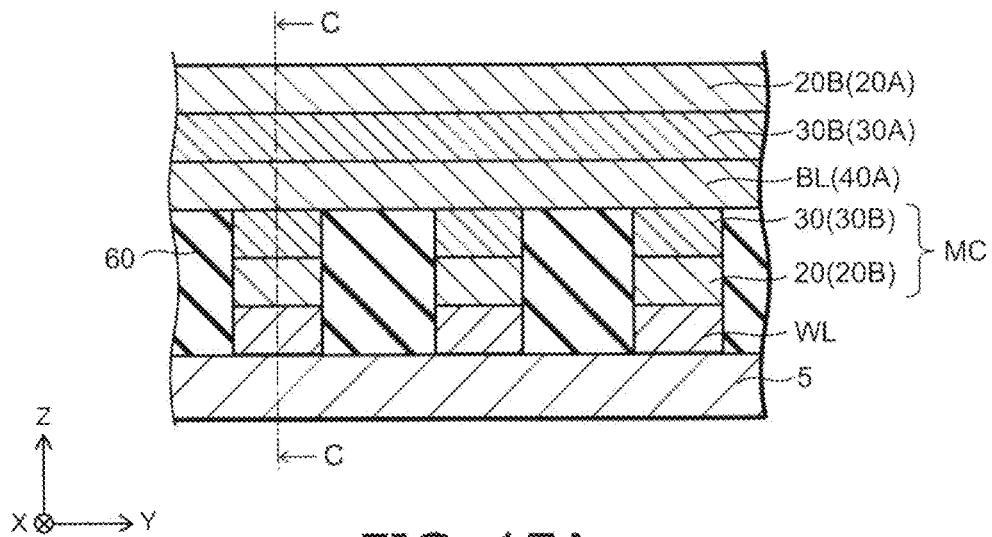
Figure 17B:
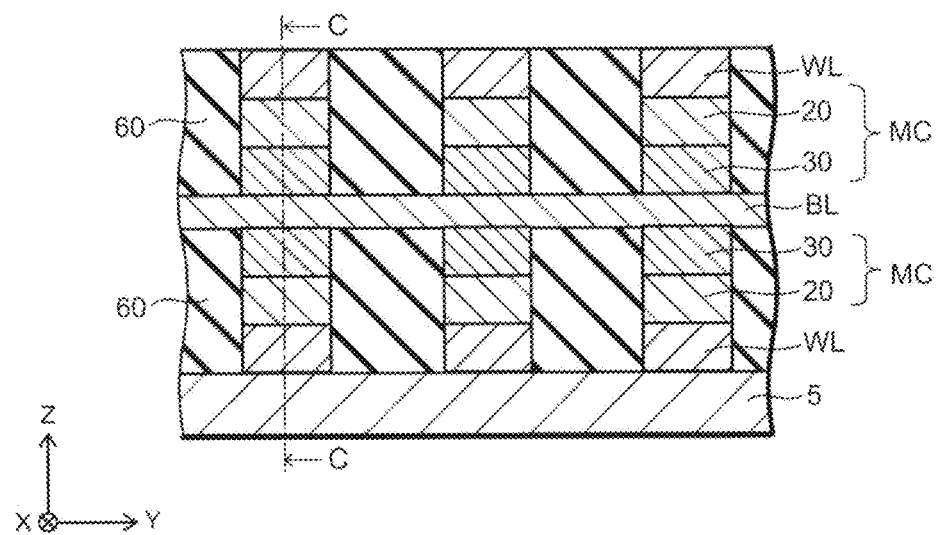
Figure 18A:
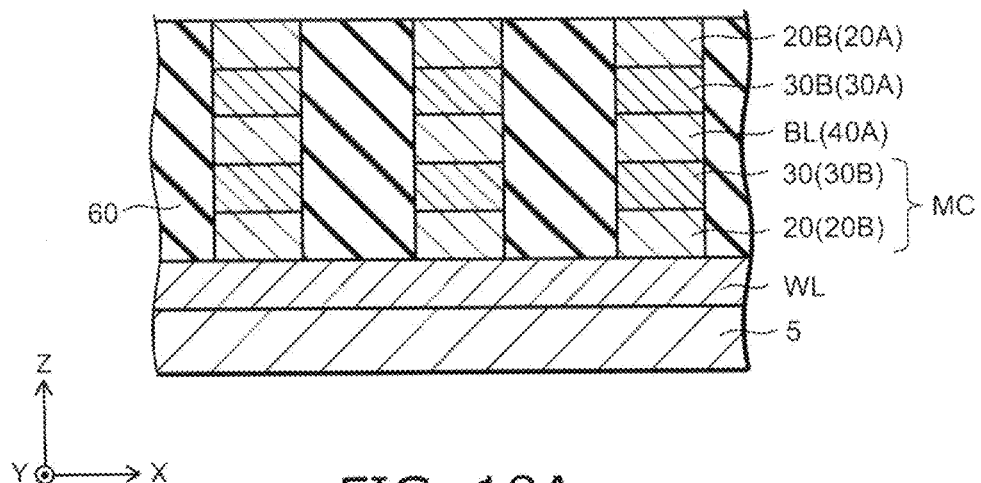
Figure 18B:
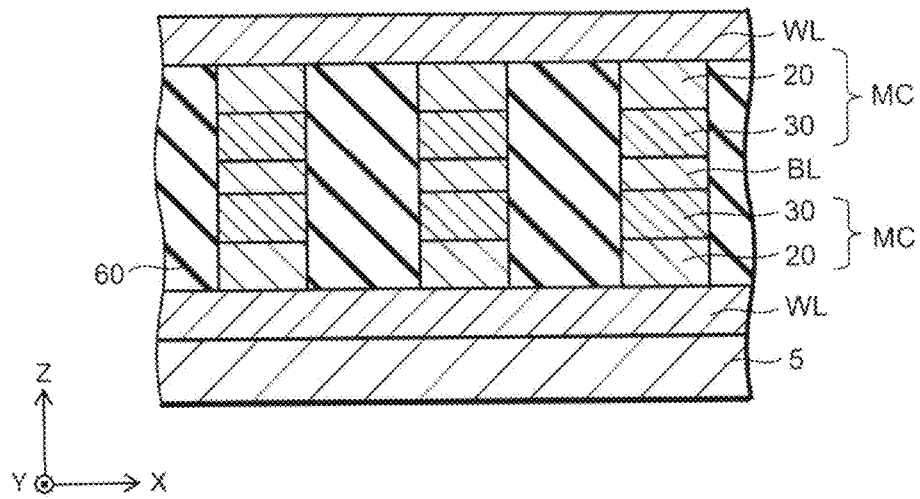

FIGS. 17A and 17B show the state in each manufacturing step subsequent to FIGS. 15A to 15C as a schematic sectional view as viewed in the X-axis direction. FIGS. 18A and 18B are schematic sectional views illustrating the C-C cross section of FIGS. 17A and 17B.

First, as shown in FIGS. 15A and 16A, on the major surface of a substrate 5, a first conductive layer material film 10A, a rectifying element material film 20A, and a memory film 30A are stacked in this order from bottom to form a stacked body ST1. The first conductive layer material film 10A is made of e.g. W. The rectifying element material film 20A includes a semiconductor film (e.g., a film of a p-type semiconductor material and an n-type semiconductor material). The semiconductor film of the rectifying element material film 20A includes amorphous silicon. The memory film 30A is made of e.g. metal oxide or organic material.

These films can be formed by various film formation methods such as the sputtering method and CVD method.

Like the foregoing, formation of the rectifying element material film 20A may be performed at a temperature temporarily exceeding 600° C., or performed with the addition of e.g. Ge. Furthermore, between the rectifying element material film 20A and the memory film 30A, a metal material film for silicide film formation may be formed. Furthermore, the memory film 30A may include a high concentration semiconductor material film having a relatively high n-type impurity concentration or p-type impurity concentration.

Next, heating treatment is performed on the rectifying element material film 20A. The heating treatment is annealing (e.g., RTA) at a temperature capable of forming a crystal grain GR in the film. The annealing temperature is e.g. 725° C. or more and 800° C. or less. This heating treatment advances crystallization in the amorphous silicon included in the rectifying element material film 20A, and produces e.g. polycrystalline silicon. As shown in FIG. 5A, in the rectifying element material film 20A, a crystal grain GR is formed so as to spread in the film.

Here, a metal material film for silicide film formation may have been formed between the rectifying element material film 20A and the memory film 30A. In this case, after forming this metal material film, if annealing for the crystallization of the rectifying element material film 20A is performed, the metal material film is silicidized and turned into a silicide film. Furthermore, in the case where a high concentration semiconductor material film has been formed, the high concentration semiconductor material film is crystallized by this annealing.

Next, as shown in FIGS. 15B and 16B, on the aforementioned stacked body ST1, a suitable etching mask is provided by the photolithography technique. Then, by the etching technique, etching processing is performed on the stacked body ST1 so as to obtain strip shapes extending in the X-axis direction. The etching is performed to the depth of the interface between the substrate 5 and the first conductive layer material film 10A. By this etching, the first conductive layer material film 10A is turned into strip-shaped first conductive layers WL extending in the X-axis direction. The rectifying element material film 20A is turned into strip-shaped rectifying element material films 20B extending in the X-axis direction. The memory film 30A is turned into strip-shaped memory films 30B extending in the X-axis direction.

Next, as shown in FIGS. 15C and 16C, the space formed by the foregoing etching is filled with an interlayer insulating film 60. The upper surface of the interlayer insulating film 60 is planarized by e.g. CMP. At the upper surface of the interlayer insulating film 60, the upper surface of the strip-shaped memory film 30B is exposed.

Next, on the interlayer insulating film 60, a second conductive layer material film 40A, a rectifying element material film 20A, and a memory film 30A are stacked in this order from bottom to form a stacked body ST2. The second conductive layer material film 40A is made of e.g. W. The stacked body ST2 has the same configuration as the stacked body ST1 except that the stacking order is reversed. However, the stacked body ST2 may be configured in the same stacking order as the stacked body ST1. Furthermore, like the foregoing, formation of the rectifying element material film 20A may be performed at a temperature temporarily exceeding 600° C., or performed with the addition of e.g. Ge.

Next, heating treatment is performed on the rectifying element material film 20A. Like the foregoing, the heating treatment is annealing (e.g., RTA) at a temperature capable of forming a crystal grain GR in the film. The annealing temperature is e.g. 725° C. or more and 800° C. or less. This heating treatment advances crystallization in the amorphous silicon included in the rectifying element material film 20A, and produces e.g. polycrystalline silicon. As shown in FIG. 5A, in the rectifying element material film 20A, a crystal grain GR is formed so as to spread in the film.

Next, as shown in FIGS. 17A and 18A, on the aforementioned stacked body ST2, a suitable etching mask is provided by the photolithography technique. Then, by the etching technique, etching processing is performed on the stacked body ST2 so as to obtain strip shapes extending in the Y-axis direction. The etching is performed to the depth of the interface between the first conductive layer WL of the first layer and the strip-shaped rectifying element material film 20B.

By this etching, the second conductive layer material film 40A is turned into strip-shaped second conductive layers BL extending in the Y-axis direction. The memory film 30A on the second conductive layer BL is turned into strip-shaped memory films 30B extending in the Y-axis direction. The rectifying element material film 20A is turned into strip-shaped rectifying element material films 20B extending in the Y-axis direction.

Furthermore, by this etching, the strip-shaped memory film 30B below the second conductive layer BL is turned into a pillar-shaped variable resistance element 30. Furthermore, the strip-shaped rectifying element material film 20B is turned into a pillar-shaped rectifying element 20. That is, below the second conductive layer BL, a memory cell MC in the first layer is formed.

Then, as shown in FIGS. 17B and 18B, by the photolithography technique and etching technique, etching processing is performed to divide the strip-shaped memory film 30A and strip-shaped rectifying element material film 20A extending in the Y-axis direction. The etching is performed to the depth of the interface between the second conductive layer BL and the strip-shaped memory film 30B. By this etching, on the second conductive layer BL, a pillar-shaped memory cell MC (the stacked structure of a variable resistance element 30 and a rectifying element 20) is formed.

After the etching, the space formed by the etching is filled with an interlayer insulating film 60. The upper surface of the interlayer insulating film 60 is planarized by e.g. CMP. On the rectifying element 20 exposed at the upper surface of the interlayer insulating film 60, a first conductive layer WL extending in the X-axis direction is formed.

By the process so far, two layers of memory cells MC are formed in the Z-axis direction. By repeating similar processing, three or more layers of memory cells MC can be formed.

In the above process, before etching the stacked bodies ST1 and ST2 to form memory cells MC, the rectifying element material film 20A is crystallized to form a crystal grain GR spread in the film. Thus, this process can manufacture a nonvolatile storage device in which the rectifying elements 20 of adjacent memory cells MC include a crystal CR of the same orientation.

In the second specific example, when the stacked body ST2 is etched in strip shapes in the Y-axis direction, the strip-shaped memory film 30B and the strip-shaped rectifying element material film 20B below the second conductive layer material film 40A are also collectively etched to form memory cells MC in the first layer. This can reduce the number of etching steps as compared with the case of forming memory cells MC by separately etching the stacked bodies ST1 and ST2.

Here, specific examples of the material used for the rectifying element 20 and the variable resistance element 30 are described. In the following description, for instance, x in $WSi_x$ represents an arbitrary composition ratio per one mole (mol) of W atoms.

<Rectifying Element>

In the case where the rectifying element 20 is a diode, the p-type semiconductor layer and the n-type semiconductor layer are made of a material selected from the group consisting of e.g. Si, SiGe, SiC, Ge, C, group III-V semiconductor such as GaAs, group II-VI semiconductor such as ZnSe, oxide semiconductor, nitride semiconductor, carbide semiconductor, and sulfide semiconductor.

The p-type semiconductor layer (anode layer) is preferably made of one or a combination of a plurality of p-type Si, $TiO_2$, $ZrO_2$, $InZnO_x$, ITO, Sb-containing $SnO_2$, Al-containing ZnO, $AgSbO_3$, $InGaZnO_4$, ZnO, and $SnO_2$.

The n-type semiconductor layer (cathode layer) is preferably made of one or a combination of a plurality of n-type Si, $NiO_x$, ZnO, $Rh_2O_3$, N-containing ZnO, and $La_2CuO_4$.

<Silicide Film>

The metal material for forming a silicide film between the rectifying element 20 and the variable resistance element 30 is one or a combination of two or more of e.g. Ti, Rh, Pd, Ag, Cd, In, Sn, La, Hf, Ta, W, Re, Os, Ir, Pt, and Au.

<Other Constituent Materials>

The material used for the insulating layer and amorphous layer used for the rectifying element 20 as needed, and the variable resistance element 30 are selected from e.g. the materials listed below. These materials may be used with e.g. Si, $p^+$-Si, $n^+$-Si, semiconductor, $p^+$-Semiconductor or $n^+$-Semiconductor, as laminate structure in case where the materials are used as the memory film 30A.

(1) Oxides (1-1) $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO (1-2) $AB_2O_4$ Here, A and B are identical or different elements, and one or a combination of a plurality of Al, Sc, Ti, V, Cr, Mn, Fe, Co, Ni, Cu, Zn, Ga, and Ge.

For instance, $Fe_3O_4$, $FeAl_2O_4$, $Mn_{1+x}Al_{2-x}O_{4+y}$, $Co_{1+x}Al_{2-x}O_{4+y}$, and $MnO_x$.

(1-3) $ABO_3$

Here, A and B are identical or different elements, and constituted by one or a combination of a plurality of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

For instance, $LaAlO_3$, $SrHfO_3$, $SrZrO_3$, and $SrTiO_3$.

(2) Oxynitrides

One or a combination of a plurality of e.g. SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON.

The variable resistance element 30 is made of e.g. binary or ternary metal oxide or organic material (including monolayer film and nanotube). For instance, in the case of carbon, the organic material includes a two-dimensional structure such as monolayer film, nanotube, graphene, and fullerene. The metal oxide includes (1) oxides and (2) oxynitrides described above.

Next, the timing of heating the rectifying element material film is described.

FIGS. 19 to 22 are flow charts describing specific examples of the timing of heating treatment.

Figure 19:
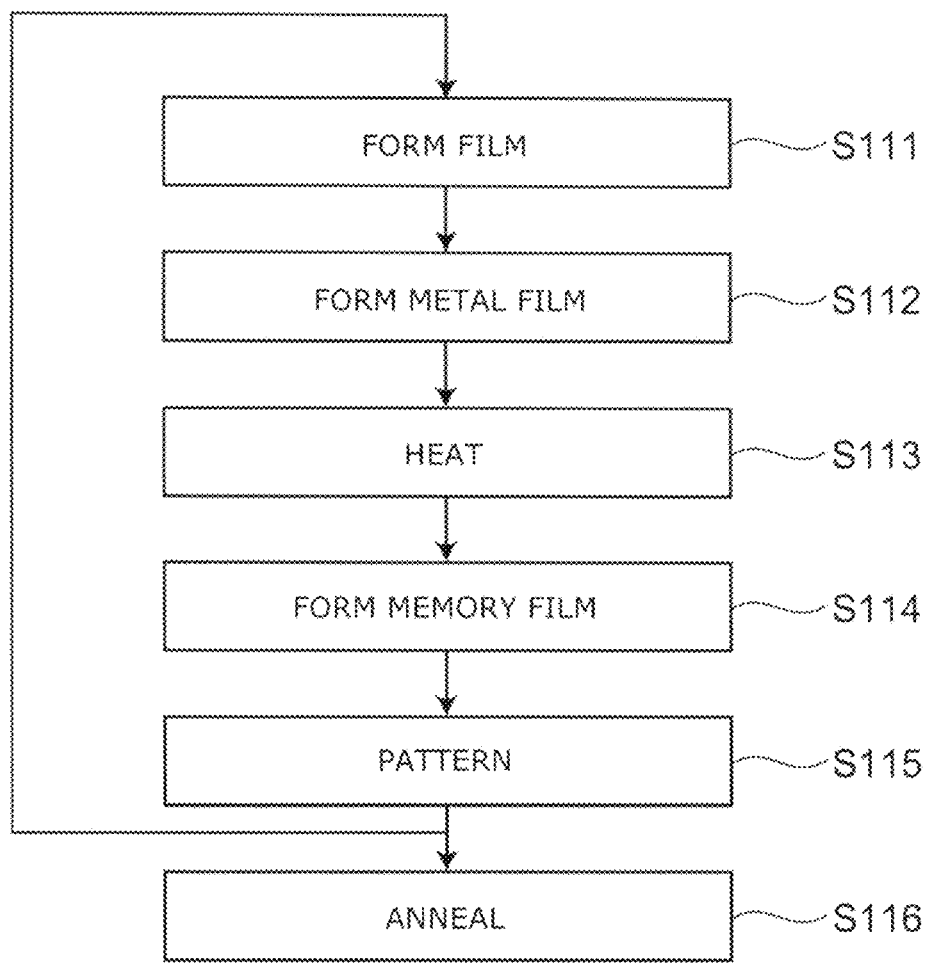
FIGS. 19 to 22 are flow charts describing specific examples of the timing of heating treatment.

FIG. 19 is a flow chart illustrating the timing of heating treatment (first example).

First, film formation processing for forming a rectifying element material film 20A is performed (step S111). The rectifying element material film 20A includes an amorphous silicon film.

Next, a metal film is formed (step S112). The metal film is a metal material film (second metal material film 72A) for forming a silicide film.

Next, heating treatment is performed (step S113). The heating treatment is e.g. RTA at 725° C. or more and 800° C. or less. By this annealing, crystallization of the amorphous silicon film proceeds, and the metal material film is silicidized.

Next, a memory film 30A is formed (step S114).

Next, patterning is performed (step S115). In the patterning, memory cells MC are formed by patterning the stacked body ST.

In the case of forming a plurality of layers of memory cells MC, the processing of steps S111-S115 is repeated.

Then, annealing treatment is performed (step S116). In the annealing treatment, for instance, RTA is performed at 725° C. or more and 800° C. or less, like the crystallization. This repairs crystal defects in the semiconductor layer.

Figure 20:
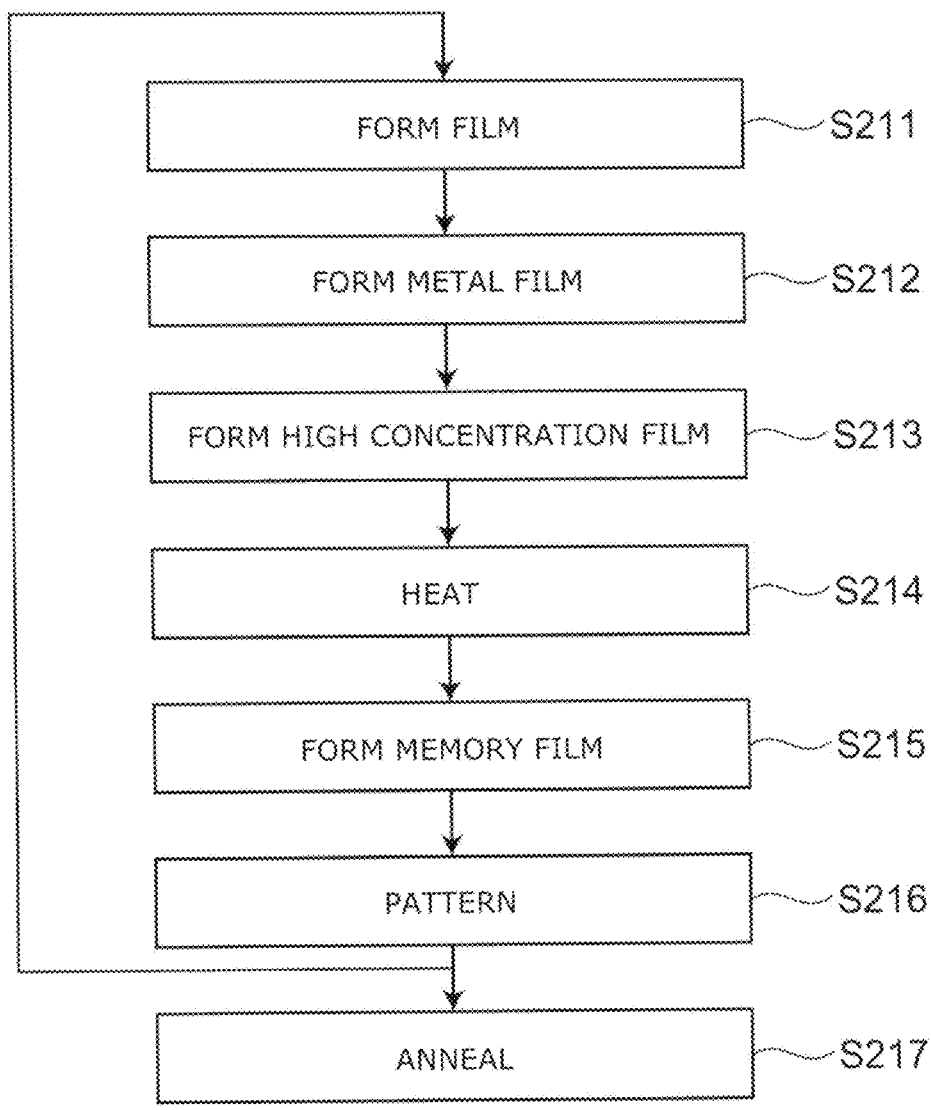

FIG. 20 is a flow chart illustrating the timing of heating treatment (second example).

First, film formation processing for forming a rectifying element material film 20A is performed (step S211). The rectifying element material film 20A includes amorphous silicon.

Next, a metal film is formed (step S212). The metal film is a metal material film (second metal material film 72A) for forming a silicide film.

Next, a high concentration film is formed (step S213). The high concentration film is a film constituting a high concentration layer 31, and includes e.g. amorphous silicon.

Next, heating treatment is performed (step S214). The heating treatment is e.g. RTA at 725° C. or more and 800° C. or less. By this annealing, crystallization of the amorphous silicon film proceeds, and the metal material film is silicidized. Furthermore, by this annealing, the high concentration film is also crystallized.

Next, a memory film 30A is formed (step S215).

Next, patterning is performed (step S216). In the patterning, memory cells MC are formed by patterning the stacked body ST.

In the case of forming a plurality of layers of memory cells MC, the processing of steps S211-S216 is repeated.

Then, annealing treatment is performed (step S217). In the annealing treatment, for instance, RTA is performed at 725° C. or more and 800° C. or less, like the crystallization. This repairs crystal defects in the semiconductor layer.

Figure 21:
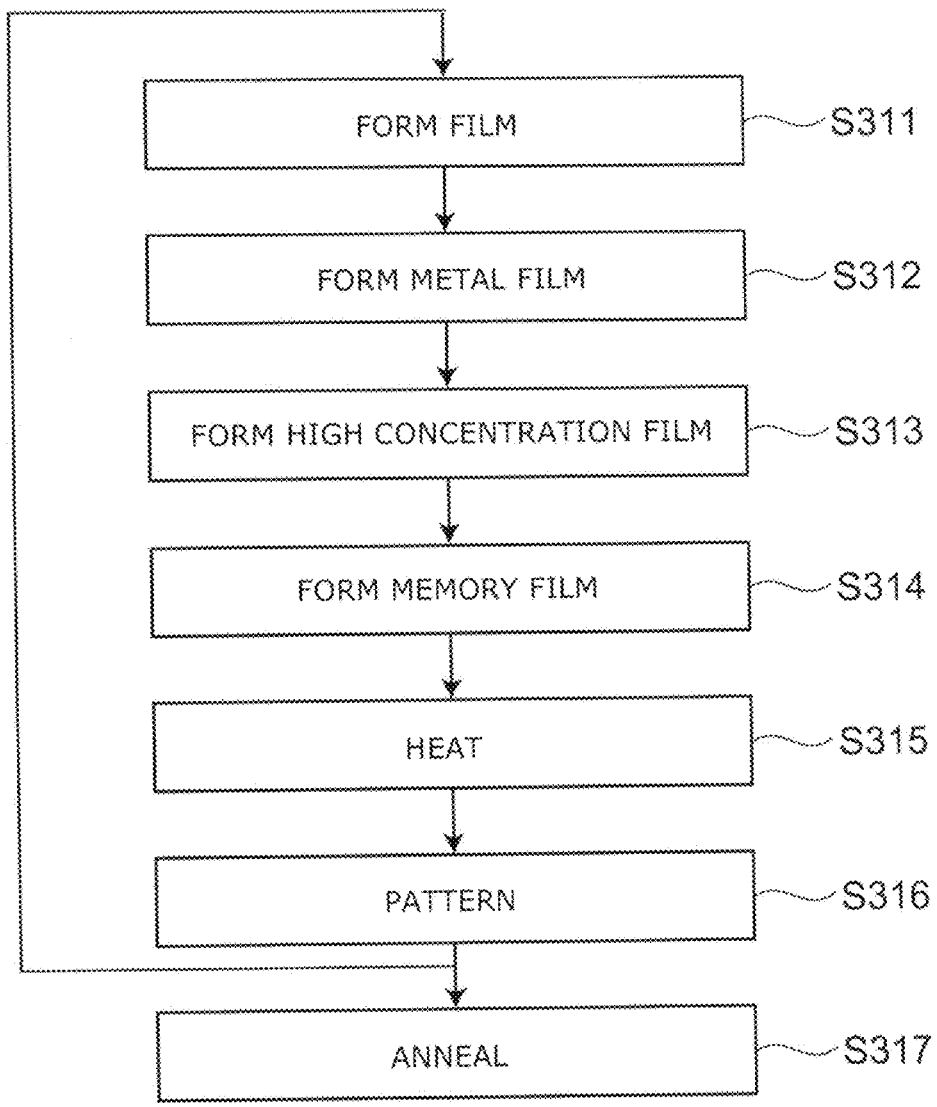

FIG. 21 is a flow chart illustrating the timing of heating treatment (third example).

First, film formation processing for forming a rectifying element material film 20A is performed (step S311). The rectifying element material film 20A includes an amorphous silicon film.

Next, a metal film is formed (step S312). The metal film is a metal material film (second metal material film 72A) for forming a silicide film.

Next, a high concentration film is formed (step S313). The high concentration film is a film constituting a high concentration layer 31, and includes e.g. amorphous silicon.

Next, a memory film 30A is formed (step S314).

Next, heating treatment is performed (step S315). The heating treatment is e.g. RTA at 725° C. or more and 800° C. or less. By this annealing, crystallization of the amorphous silicon film proceeds, and the metal material film is silicidized. Furthermore, by this annealing, the high concentration semiconductor material film is also crystallized.

Next, patterning is performed (step S316). In the patterning, memory cells MC are formed by patterning the stacked body ST.

In the case of forming a plurality of layers of memory cells MC, the processing of steps S311-S316 is repeated.

Then, annealing treatment is performed (step S317). In the annealing treatment, for instance, RTA is performed at 725° C. or more and 800° C. or less, like the crystallization. This repairs crystal defects in the semiconductor layer.

Figure 22:
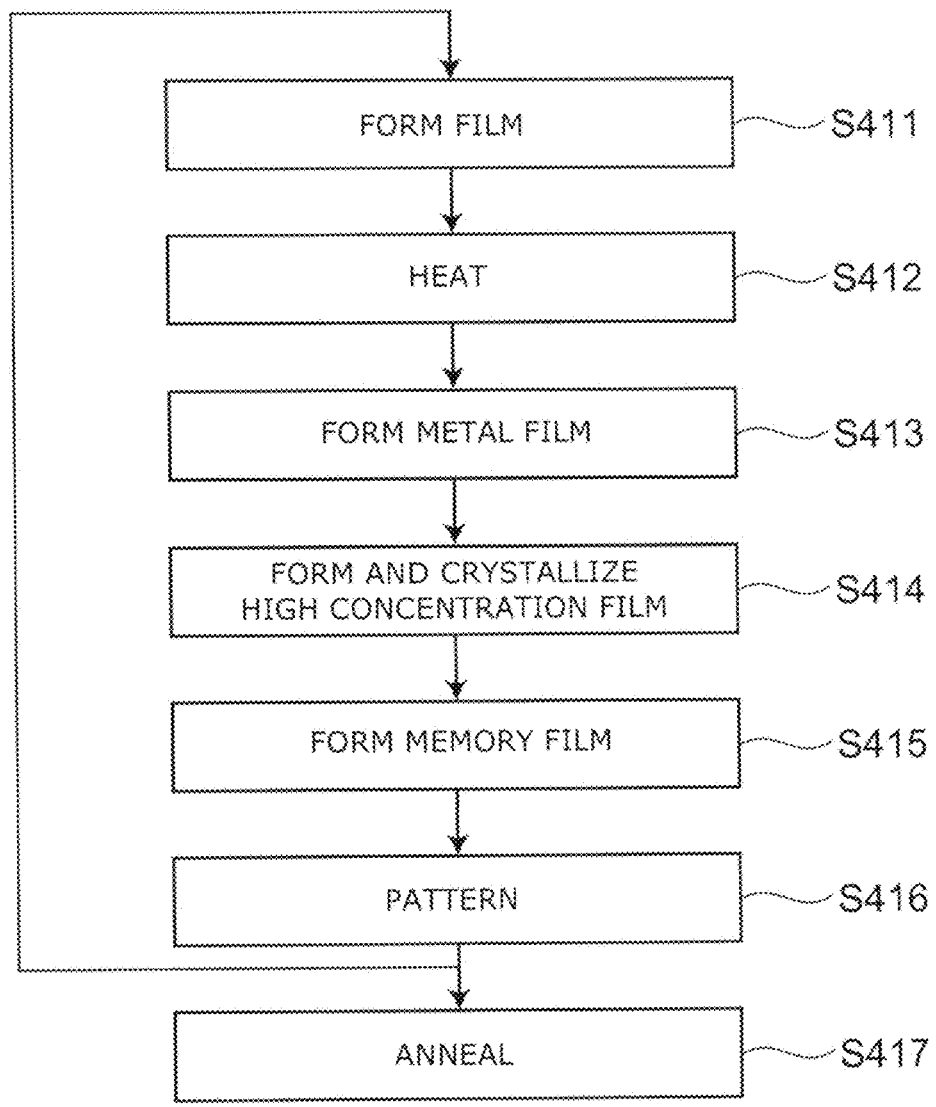

FIG. 22 is a flow chart illustrating the timing of heating treatment (fourth example).

First, film formation processing for forming a rectifying element material film 20A is performed (step S411). The rectifying element material film 20A includes an amorphous silicon film.

Next, heating treatment is performed (step S412). The heating treatment is e.g. RTA at 725° C. or more and 800° C. or less. By this annealing, crystallization of the amorphous silicon film proceeds.

Next, a metal film is formed (step S413). The metal film is a metal material film (second metal material film 72A) for forming a silicide film.

Next, a high concentration film is formed and crystallized (step S414). The high concentration film is a film constituting a high concentration layer 31, and includes e.g. amorphous silicon. In this step S414, after forming the high concentration film, annealing is performed to crystallize amorphous silicon.

Next, a memory film 30A is formed (step S415).

Next, patterning is performed (step S416). In the patterning, memory cells MC are formed by patterning the stacked body ST.

In the case of forming a plurality of layers of memory cells MC, the processing of steps S411-S416 is repeated.

Then, annealing treatment is performed (step S417). In the annealing treatment, for instance, RTA is performed at 725° C. or more and 800° C. or less, like the crystallization. This repairs crystal defects in the semiconductor layer.

In any of the timings of heating treatment described above, the rectifying element material film 20A is heated and crystallized before patterning the stacked body ST. Thus, before patterning the stacked body ST, a crystal grain GR is formed so as to spread in the rectifying element material film 20A. In this state, the stacked body ST is patterned. Thus, the semiconductor layers of the respective rectifying elements 20 of two adjacent memory cells MC include a crystal of the same orientation.

In each timing of heating treatment described above, in forming the rectifying element material film 20A including an amorphous silicon film, the film formation may be performed at a temperature temporarily exceeding 600° C. to form silicon microcrystals in part of the amorphous silicon film. Then, crystallization may be accelerated by heating treatment performed later. Furthermore, in film formation, a material acting as a crystal nucleus such as Ge may be added. This can accelerate crystallization of the amorphous silicon film when heating treatment is performed.

The timings shown in FIGS. 19 to 22 all follow the order of forming a rectifying element material film 20A, forming a metal film, and forming a memory film. However, these may be performed in the reverse order, i.e., in the order of forming a memory film, forming a metal film, and forming an amorphous silicon film. That is, depending on the stacking order of the rectifying element 20 and the variable resistance element 30 in the unit memory layer MU, the stacking order of the amorphous silicon film, the metal film, and the memory film is changed.

As described above, the nonvolatile storage device and the method for manufacturing the same according to the embodiments can improve the characteristics of the rectifying element included in the memory cell.

The embodiments and the variations thereof have been described above. However, the invention is not limited to these examples. For instance, those skilled in the art can modify the above embodiments or the variations thereof by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile storage device comprising:
a plurality of first conductive layers each extending in a first direction;
a plurality of second conductive layers each extending in a second direction non-parallel to the first direction and spaced from the first conductive layers in a third direction orthogonal to the first direction; and
memory cells each provided between the plurality of first conductive layers and the plurality of second conductive layers, the memory cell including a rectifying element including a semiconductor layer, and a variable resistance element stacked with the rectifying element in the third direction,
at least two adjacent memory cells of a plurality of the memory cells including the semiconductor layer, and the semiconductor layer including polycrystalline silicon, and the polycrystalline silicon including crystal grains of the same orientation, a grain size of at least one of the crystal grains being larger than a distance between the at least two adjacent memory cells.

2. The device according to claim 1, wherein the memory cell includes a silicide film between the rectifying element and the variable resistance element.

3. The device according to claim 2, wherein the silicide film includes one or a combination of two or more of Ti, Rh, Pd, Ag, Cd, In, Sn, La, Hf, Ta, W, Re, Os, Ir, Pt, and Au.

4. The device according to claim 2, wherein the silicide film has a thickness of 1 nanometer or more and 3 nanometers or less.

5. The device according to claim 2, wherein the memory cell includes a metal nitride film between the silicide film and the variable resistance element.

6. The device according to claim 1, wherein striped patterns appear on a same extension line in a cross section surface of the semiconductor layer of each of the two adjacent memory cells.

7. The device according to claim 1, wherein half pitch of the memory cells is smaller than 30 nm.

* * * * *